United States Patent
Kao et al.

(10) Patent No.: US 11,901,387 B2
(45) Date of Patent: Feb. 13, 2024

(54) IMAGE SENSOR

(71) Applicant: Taiwan Semiconductor Manufacturing Company, Ltd., Hsinchu (TW)

(72) Inventors: Min-Feng Kao, Chiayi (TW); Dun-Nian Yaung, Taipei (TW); Jen-Cheng Liu, Hsin-Chu (TW); Wen-Chang Kuo, Tainan (TW); Sheng-Chau Chen, Tainan (TW); Feng-Chi Hung, Hsin-Chu County (TW); Sheng-Chan Li, Tainan CIty (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/369,567

(22) Filed: Jul. 7, 2021

(65) Prior Publication Data
US 2022/0278144 A1  Sep. 1, 2022

Related U.S. Application Data

(60) Provisional application No. 63/154,113, filed on Feb. 26, 2021.

(51) Int. Cl.
*H01L 27/146* (2006.01)
*H01L 21/762* (2006.01)

(52) U.S. Cl.
CPC .... *H01L 27/1463* (2013.01); *H01L 21/76224* (2013.01); *H01L 27/14621* (2013.01); *H01L 27/14627* (2013.01); *H01L 27/14683* (2013.01)

(58) Field of Classification Search
None
See application file for complete search history.

(56) References Cited

U.S. PATENT DOCUMENTS

| | | | |
|---|---|---|---|
| 9,859,323 B1 | 1/2018 | Chen et al. | |
| 2013/0069190 A1* | 3/2013 | Kao | H01L 27/1464 257/E31.127 |
| 2015/0294997 A1* | 10/2015 | Kim | H01L 27/14612 257/446 |
| 2016/0276394 A1* | 9/2016 | Chou | H01L 27/14636 |
| 2017/0062496 A1 | 3/2017 | Lai | |
| 2017/0250211 A1* | 8/2017 | Chang | H01L 27/14643 |
| 2019/0198547 A1* | 6/2019 | Yoshigiwa | H01L 27/1463 |
| 2021/0043671 A1* | 2/2021 | Yoneda | H01L 27/1464 |

FOREIGN PATENT DOCUMENTS

| | | |
|---|---|---|
| KR | 20160072078 A | 6/2016 |
| KR | 20180077393 A | 7/2018 |
| KR | 20190041490 A | 4/2019 |
| KR | 20210018091 A | 2/2021 |

\* cited by examiner

*Primary Examiner* — Ali Naraghi
(74) *Attorney, Agent, or Firm* — HAYNES AND BOONE, LLP

(57) ABSTRACT

A semiconductor device according to the present disclosure includes a semiconductor layer, a plurality of metal isolation features disposed in the semiconductor layer, a metal grid disposed directly over the plurality of metal isolation features, and a plurality of microlens features disposed over the metal grid.

20 Claims, 18 Drawing Sheets

IMAGE SENSOR

PRIORITY DATA

This application is a non-provisional application of U.S. Provisional Patent Application Ser. No. 63/154,113, filed Feb. 26, 2021, which is herein incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Image sensors, such as complementary metal-oxide-semiconductor (CMOS) image sensors (CIS), are commonly found in modern-day consumer electronics. As image sensors shrink in size to keep up with the ever-increasing pixel resolution requirements, some existing image sensor structures may not provide sufficient quantum efficiency (QE). Therefore, while existing CMOS sensors are generally adequate for their intended purposes, they are not satisfactory in all aspects.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

Figure 1:
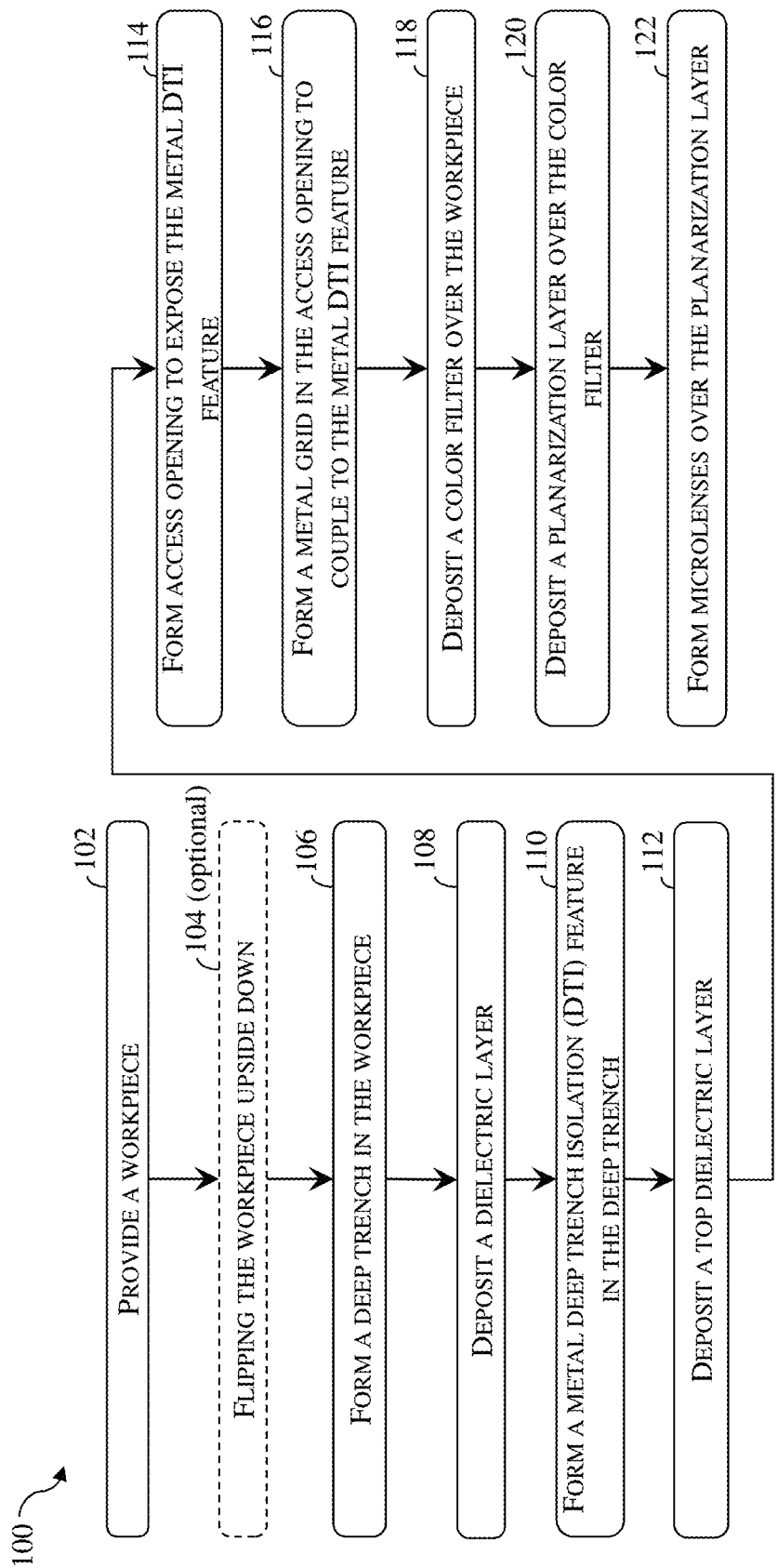
FIG. 1 is a flowchart illustrating a method of fabricating an image sensor device according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Further, when a number or a range of numbers is described with "about," "approximate," and the like, the term is intended to encompass numbers that are within a reasonable range considering variations that inherently arise during manufacturing as understood by one of ordinary skill in the art. For example, the number or range of numbers encompasses a reasonable range including the number described, such as within +/−10% of the number described, based on known manufacturing tolerances associated with manufacturing a feature having a characteristic associated with the number. For example, a material layer having a thickness of "about 5 nm" can encompass a dimension range from 4.25 nm to 5.75 nm where manufacturing tolerances associated with depositing the material layer are known to be +/−15% by one of ordinary skill in the art. Still further, the present disclosure may repeat reference numerals and/or letters in the various examples. This repetition is for the purpose of simplicity and clarity and does not in itself dictate a relationship between the various embodiments and/or configurations discussed.

Complementary metal-oxide-semiconductor (CMOS) image sensors (CIS) have gained popularity in recent years. Some existing CMOS image sensors include dielectric isolation features to isolate adjacent pixels. However, as the pixel size continues to shrink, this pixel isolation structure may not provide sufficient isolation and the quantum efficiency (QE) may suffer as a consequence. The present disclosure provides an image sensor that includes photodetectors (or photodiodes) arranged in a semiconductor layer and microlenses arranged over the photodetectors such that light passes through microlenses and is directed to the photodetectors. The photodetectors are separated from one another by a plurality of metal isolation features or metal deep trench isolation features that extend partially or completely through the semiconductor layer. A metal grid or a network of conductive features are disposed on and in direct contact with the plurality of metal isolation features. A negative bias may be applied to the plurality of metal isolation features to improve electrical isolation. The plurality of metal isolation features may also serve as reflectors to further improve quantum efficiency (QE). In sum, the structures of the present disclosure may help boost quantum efficiency (QE), reduce crosstalk, and improve performance.

The process of the present disclosure is robust and may be used to fabricate even smaller image sensors of future generations.

The various aspects of the present disclosure will now be described in more detail with reference to the figures. In that regard, FIG. 1 is a flowchart illustrating method 100 of forming an image sensor on a workpiece according to embodiments of the present disclosure. Method 100 is merely an example and is not intended to limit the present disclosure to what is explicitly illustrated in method 100. Additional steps may be provided before, during and after the method 100, and some steps described can be replaced, eliminated, or moved around for additional embodiments of the method. Not all steps are described herein in detail for reasons of simplicity. Method 100 is described below in conjunction with FIGS. 2-11, which are fragmentary cross-sectional views of a workpiece 200 at different stages of fabrication according to embodiments of method 100. Because the workpiece 200 will be fabricated into a semiconductor device or an image sensor at the conclusion of the fabrication processes, the workpiece 200 may also be referred to as the semiconductor device 200 or an image sensor 200 as the context requires. Additionally, throughout the present application, like reference numerals denote like features, unless otherwise excepted.

Figure 2:
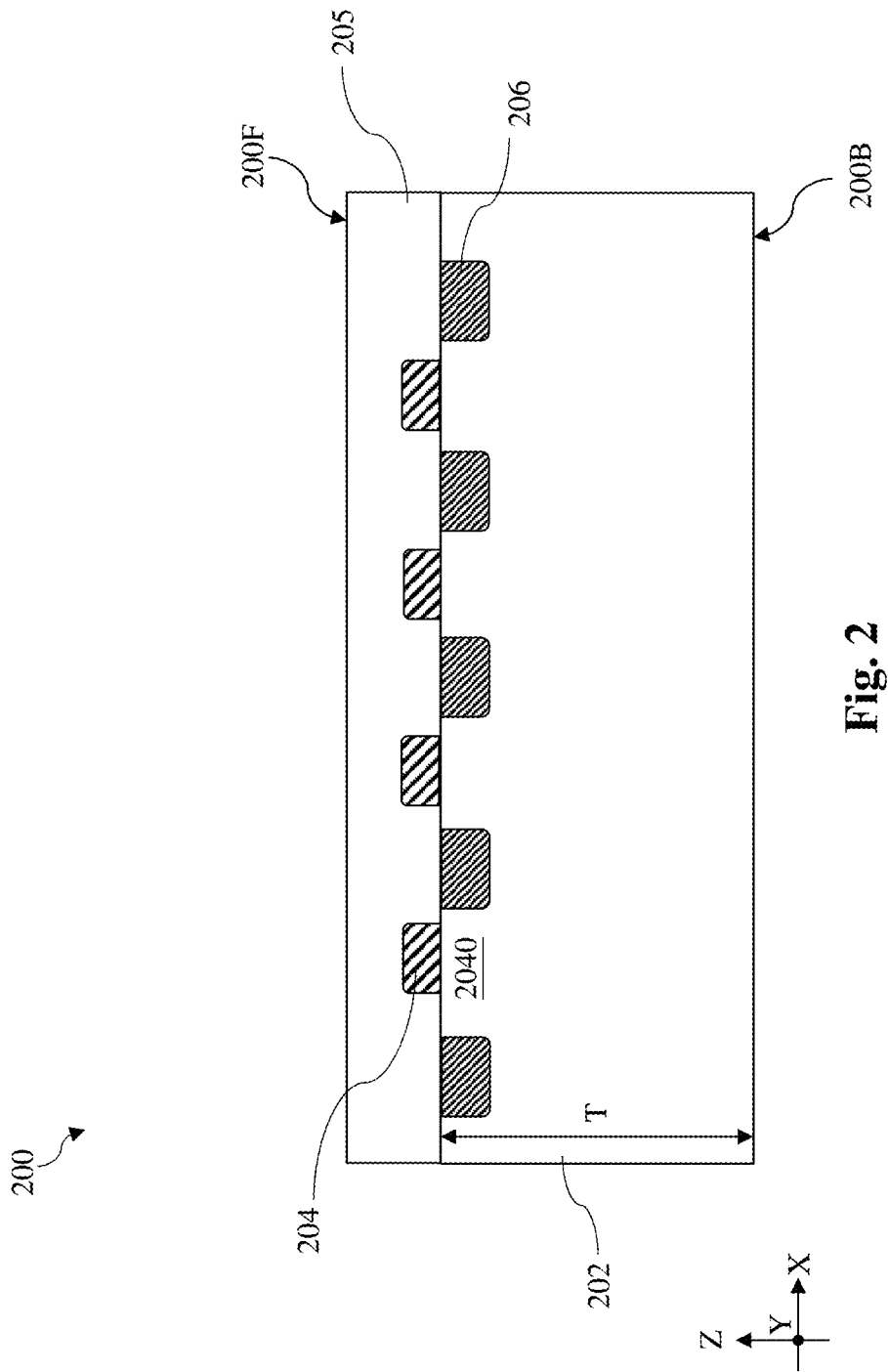
FIGS. 2-11 illustrate diagrammatic fragmentary cross-sectional views of a workpiece undergoing various stages of fabrication according to the method of FIG. 1, according to various aspects of the present disclosure.

Referring to FIGS. 1 and 2, method 100 includes a block 102 where a workpiece 200 is received. As shown in FIG. 2, the workpiece 200 includes a front side 200F and a back side 200B. When the workpiece 200 is received, processes to the front side 200F of the workpiece 200 have been performed. Such front-side processes may include formation of transistors 204 (described further below) and isolation features 206 (described further below). The workpiece 200 includes a substrate 202. The substrate 202 may be a bulk silicon (Si) substrate. Alternatively, substrate 202 may include elementary semiconductor, such as germanium (Ge); a compound semiconductor, such as silicon carbide (SiC), gallium arsenide (GaAs), gallium phosphide (GaP), indium phosphide (InP), indium arsenide (InAs), and/or indium antimonide (InSb); an alloy semiconductor, such as silicon germanium (SiGe), gallium arsenic phosphide (GaAsP), aluminum indium arsenide (AlInAs), aluminum gallium arsenide (AlGaAs), gallium indium arsenide (GaInAs), gallium indium phosphide (GaInP), and/or gallium indium arsenic phosphide (GaInAsP); or combinations thereof. In some implementations, substrate 202 includes one or more group III-V materials, one or more group II-VI materials, or combinations thereof. In still some instances, substrate 202 is a semiconductor-on-insulator substrate, such as a silicon-on-insulator (SOI) substrate, a silicon germanium-on-insulator (SGOI) substrate, or a germanium-on-insulator (GeOI) substrate. In still some embodiments, the substrate 202 may be diamond substrate or a sapphire substrate.

To form image sensing devices 240 (to be described below) in substrate 202, substrate 202 can include various doped regions (not shown), such as p-type doped regions, n-type doped regions, or combinations thereof. Because the substrate 202 includes image sensing devices 240, the substrate 202 may also be referred to as a sensor substrate 202. In one embodiment, the substrate 202 may include p-type dopants, such as boron (B), boron difluoride (BF$_2$), or other p-type dopants as well as n-type dopants, such as phosphorus (P), arsenic (As), or other n-type dopants. In this embodiment, the substrate 202 may be a commercially available silicon substrate with p-type dopants and n-type dopants are introduced to certain regions of the substrate 202 in order to form the image sensing devices 240 (shown in FIG. 4). The image sensing devices 240 may also be referred to photodetectors 240 or photodiodes 240. In some embodiments, the substrate 202 may have a thickness T between about 15 μm and about 50 μm.

The workpiece 200 has undergone front side processing and includes features formed using the front side processes. In the depicted embodiments, the workpiece 200 includes a plurality of transistors 204 that are configured to process signals from the image sensing devices 240. Each of the transistors 204 includes a source, a drain, a channel region disposed between the source and drain, and a gate structure over the channel region. It is noted that the transistor 204 shown in FIG. 2 may represent transistor of different configurations. For example, the transistors 204 may be planar transistors, fin-type field effect transistors (finFETs), multi-bridge-channel (MBC) transistors, gate-all-around (GAA) transistors, nanowire transistors, nanosheet transistors, transistors with nanostructures, or other multi-gate transistors where the gate structure engages more than one surfaces of the channel region. Active regions 2040 of the transistors 204 may be isolated from one another by a plurality of isolation features 206. Depending on the configuration of the transistors 204, active regions 2040 may have a sheet-like shape, a fin-like shape, or may include a plurality of channel members vertically spaced apart from one another. The isolation features 206 may also be referred to as shallow trench isolation (STI) features 206 and may include silicon oxide, silicon nitride, silicon oxynitride, fluorine-doped silicate glass (FSG), a low-k dielectric, combinations thereof, and/or other suitable materials. In the depicted embodiment, the workpiece 200 may further include a first interlayer dielectric (ILD) layer 205 disposed over the transistors 204. The first ILD layer 205 may include materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials.

Figure 3:
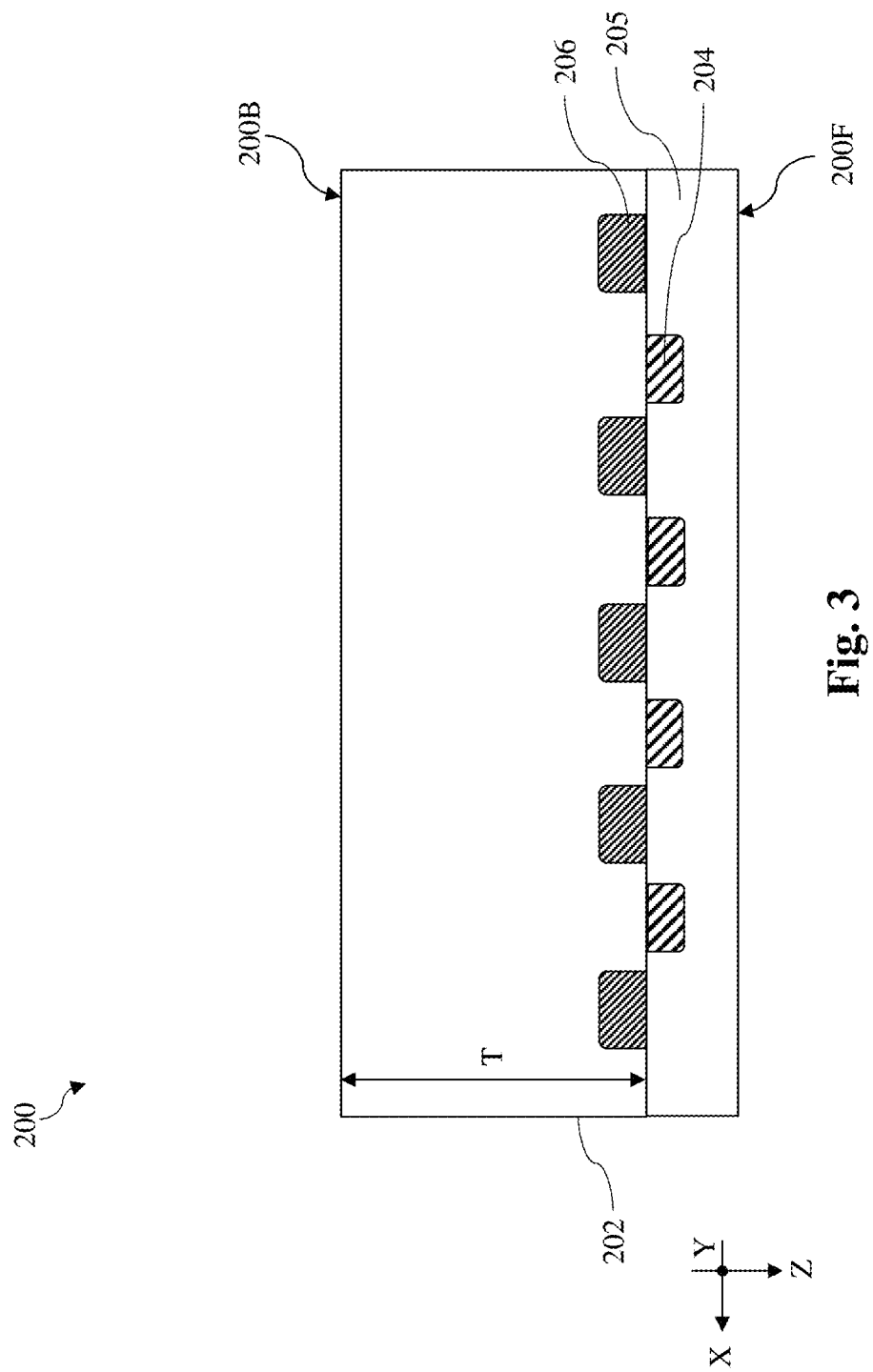

Referring to FIGS. 1 and 3, method 100 may optionally include a block 104 where the workpiece 200 is flipped up-side-down such that the back side 200B is facing up. To flip the workpiece 200 up-side-down, a carrier substrate (not explicitly shown) is bonded to the front side 200F. In some embodiments, the carrier substrate may be bonded to the workpiece 200 by fusion bonding, by use of an adhesion layer, or a combination thereof. In some instances, the carrier substrate may be formed of semiconductor materials (such as silicon), sapphire, glass, polymeric materials, or other suitable materials. In embodiments where fusion bonding is used, the carrier substrate includes a bottom oxide layer and the workpiece 200 includes a top oxide layer, such as the first ILD layer 205. After both the bottom oxide layer and top oxide layer are treated, they are placed in plush contact with one another for direct bonding at room temperature or at an elevated temperature. Once the carrier substrate is bonded to the workpiece 200, the workpiece 200 is flipped over, as shown in FIG. 3.

Figure 17:
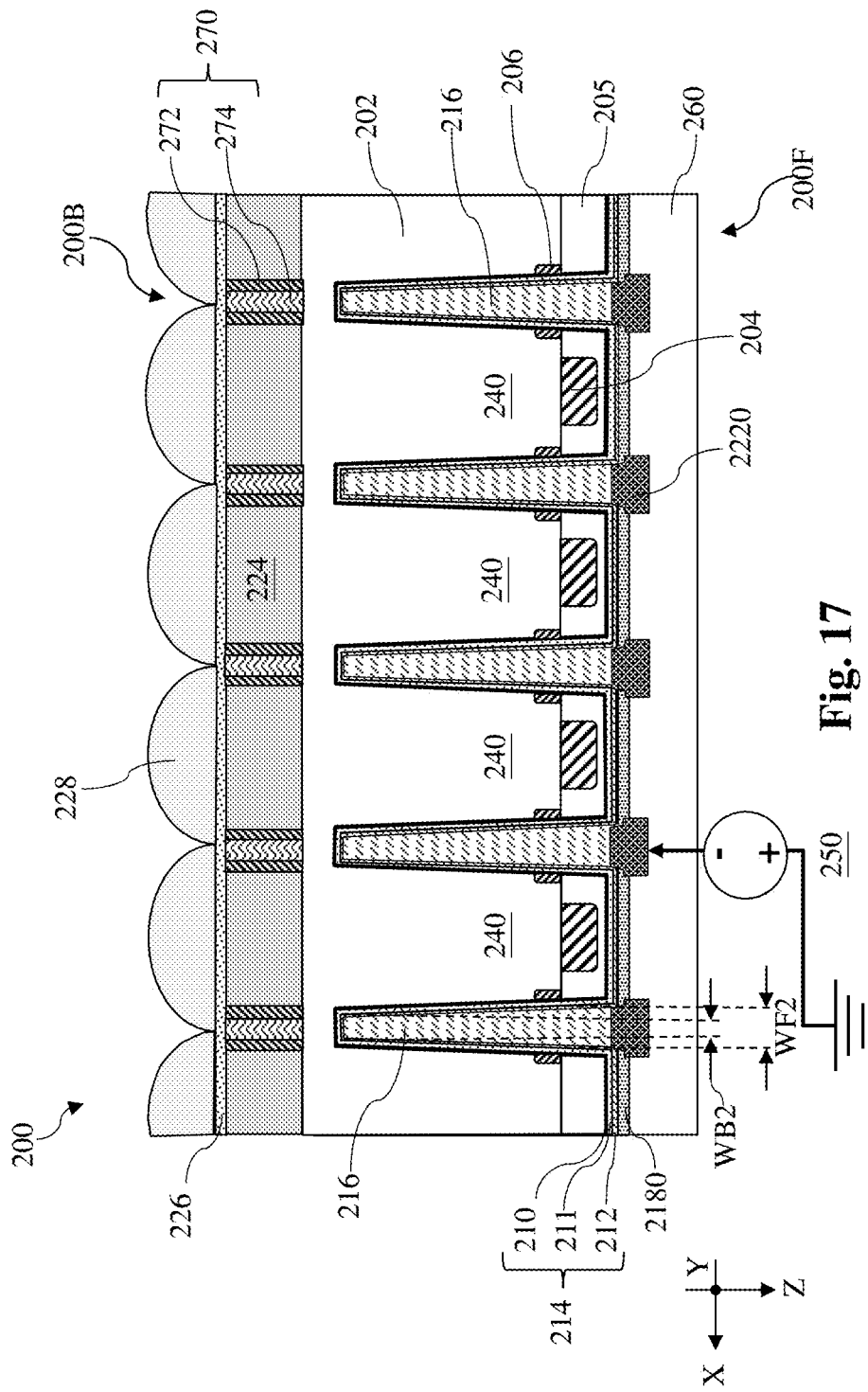
Figure 18:
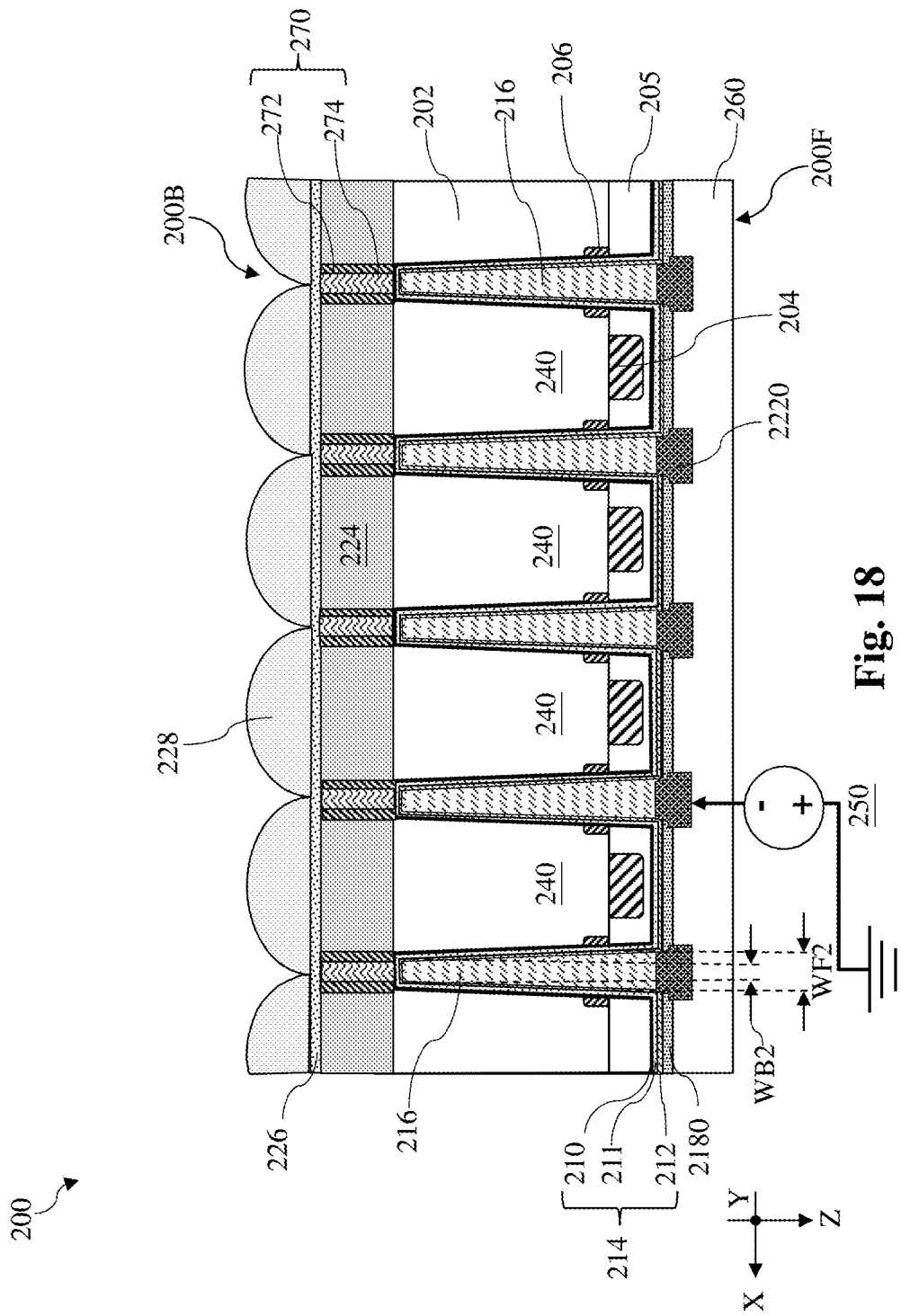

In some embodiments, operations at block 104 are omitted and the workpiece 200 is not flipped at this point. In these embodiments, operations at blocks 104-114 are performed to the front side 200F, rather than the back side 200B of the workpiece 200. When operations at block 104 are omitted, metal IDT features 216 extend into the substrate 202 from the front side 200F, as shown in FIGS. 17-18.

Figure 4:
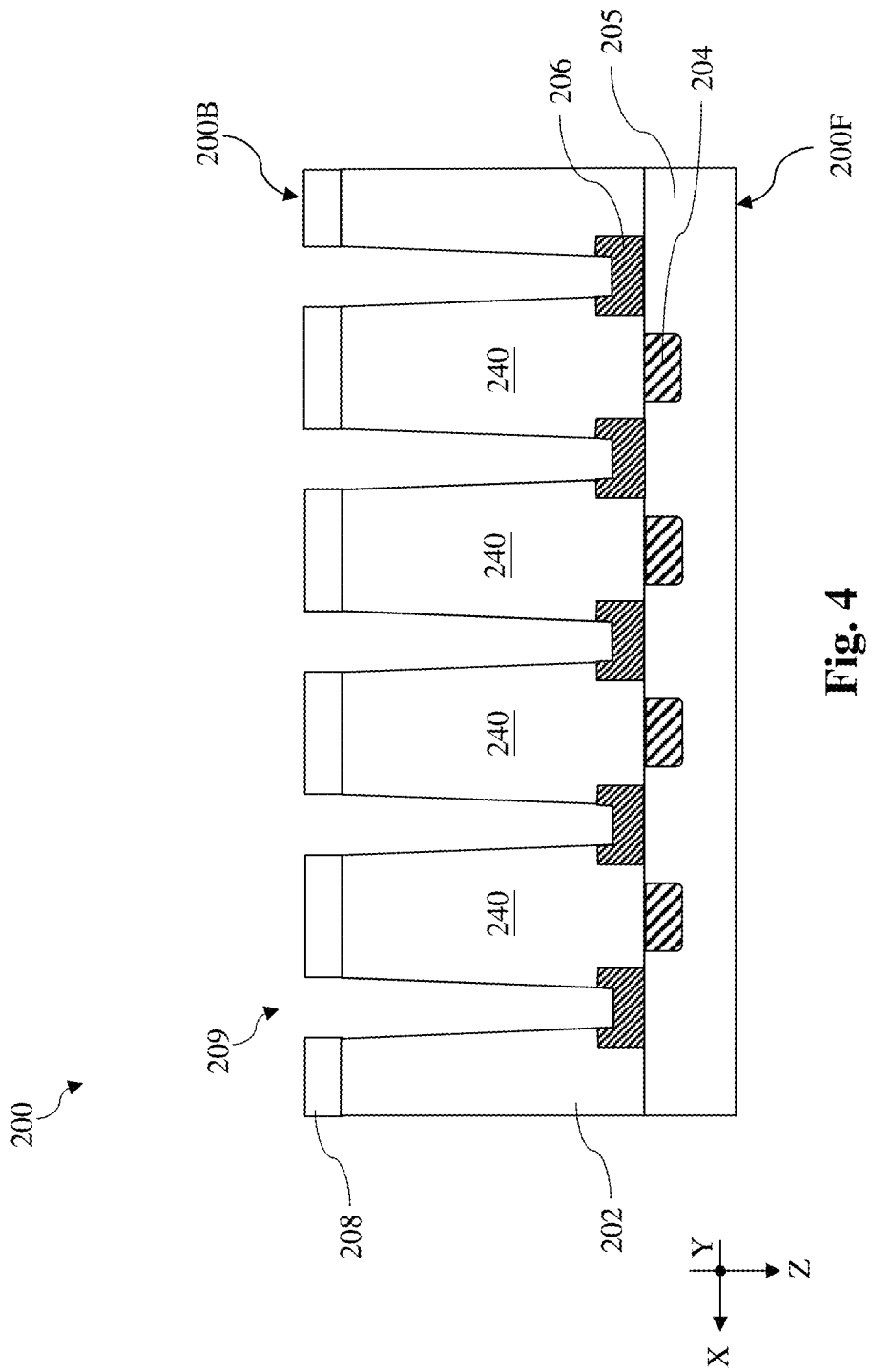

Referring to FIGS. 1 and 4, method 100 includes a block 106 where a deep trench 209 are formed in the workpiece 200. To pattern the workpiece 200 to form the deep trench 209, a hard mask 208 is formed over the back side 200B, where the substrate 202 is exposed. In some embodiments, the hard mask 208 may be a single layer or a multilayer and may be deposited using chemical vapor deposition (CVD). In one embodiment, the hard mask 208 may include a silicon nitride layer and a silicon oxide layer over the silicon nitride layer. Photolithography processes and etch processes are then performed to pattern the hard mask 208. For example, a photoresist layer (not shown) is formed over the hard mask, exposed to a suitable photolithography radiation source, and developed to form a patterned photoresist layer. The patterned photoresist layer is then used as an etch mask to pattern hard mask 208. The substrate 202 is then anisotropically etched using the patterned hard mask 208 as an etch mask, thereby forming the deep trench 209. As shown in FIG. 4, more than one deep trench 209 may be formed. The anisotropic etch may be a dry etch process that implements sulfur hexafluoride ($SF_6$), carbon tetrafluoride ($CF_4$), nitrogen trifluoride ($NF_3$), other fluorine-containing gas, oxygen ($O_2$), or a mixture thereof. The deep trench 209 may extend partially or completely through the substrate 202.

When operations at block 104 is performed, the deep trench 209 extends into the substrate 202 from the back side 200B of the workpiece 200. When operations at block 104 is not performed, the deep trench 209 extends into the substrate 202 from the front side 200F of the workpiece 200. In some embodiments illustrated in FIG. 4, the deep trench 209 extends partially through the substrate 202 and extends partially into an STI feature 206. In some embodiments illustrated in FIG. 15, the deep trench 209 (now filled with other structures, such as the metal deep trench isolation feature 216) extends partially through the substrate 202 but does not reach the STI feature 206. In some embodiments illustrated in FIG. 16, the deep trench 209 (now filled with other structures, such as the metal deep trench isolation feature 216) extends completely through the substrate 202 and the STI feature 206. In some embodiments illustrated in FIG. 17, the deep trench 209 (now filled with other structures, such as the metal deep trench isolation feature 216) extends completely through the STI feature 206 but partially through the substrate 202 from the front side 200F. In some embodiments illustrated in FIG. 18, the deep trench 209 (now filled with other structures, such as the metal deep trench isolation feature 216) extends completely through the STI feature 206 and the substrate 202 from the front side 200F.

Figure 5:
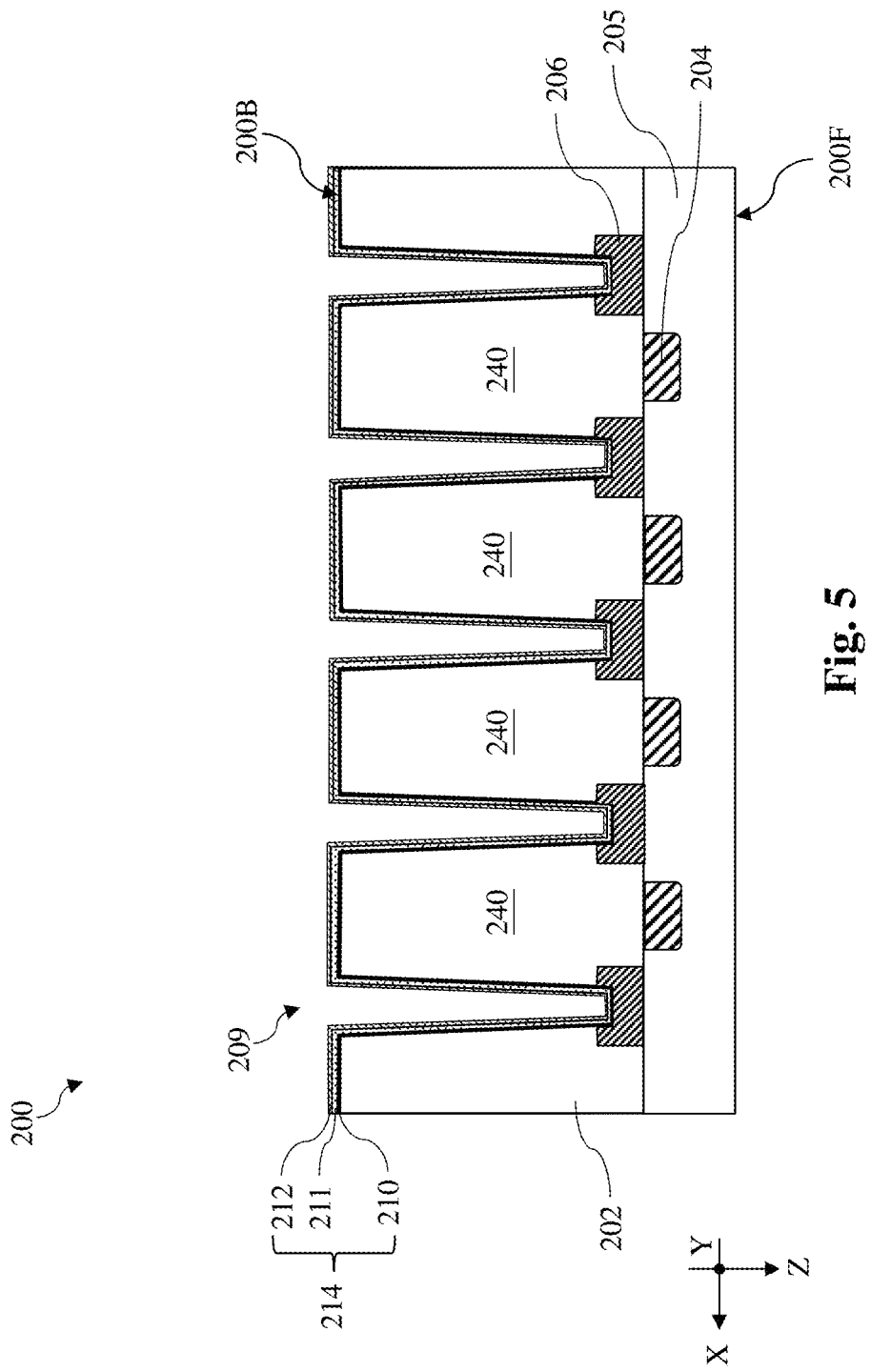

Referring to FIGS. 1 and 5, method 100 includes a block 108 where a dielectric layer 214 is deposited over the back side 200B, including over the deep trench 209. As shown in FIG. 5, the dielectric layer 214 may be a multi-layer and include a first dielectric layer 210, a second dielectric layer 211 over the first dielectric layer 210, and a third dielectric layer 212 over the second dielectric layer 211. The first dielectric layer 210 may include aluminum oxide, hafnium oxide, titanium oxide, barium titanate, zirconium oxide, lanthanum oxide, barium oxide, strontium oxide, yttrium oxide, or a combination thereof and a thickness between 2 nm and about 20 nm. The second dielectric layer 211 may include metal oxide, such as tantalum oxide ($Ta_2O_5$), titanium oxide, zirconium oxide, or a combination thereof and a thickness between 40 nm and about 60 nm. The third dielectric layer 212 may include silicon oxide, silicon nitride, silicon oxynitride, silicon carbide, or a combination thereof and a thickness between 5 nm and about 50 nm. In some implementations, each layer in the dielectric layer 214 may be conformally deposited such that each of them may line the bottom surface and sidewalls of the deep trench 209. For example, each layer in the dielectric layer 214 may be deposited using atomic layer deposition (ALD) or chemical vapor deposition (CVD). It is noted that the dielectric layer 214 does not completely fill the deep trench 209.

Figure 6:
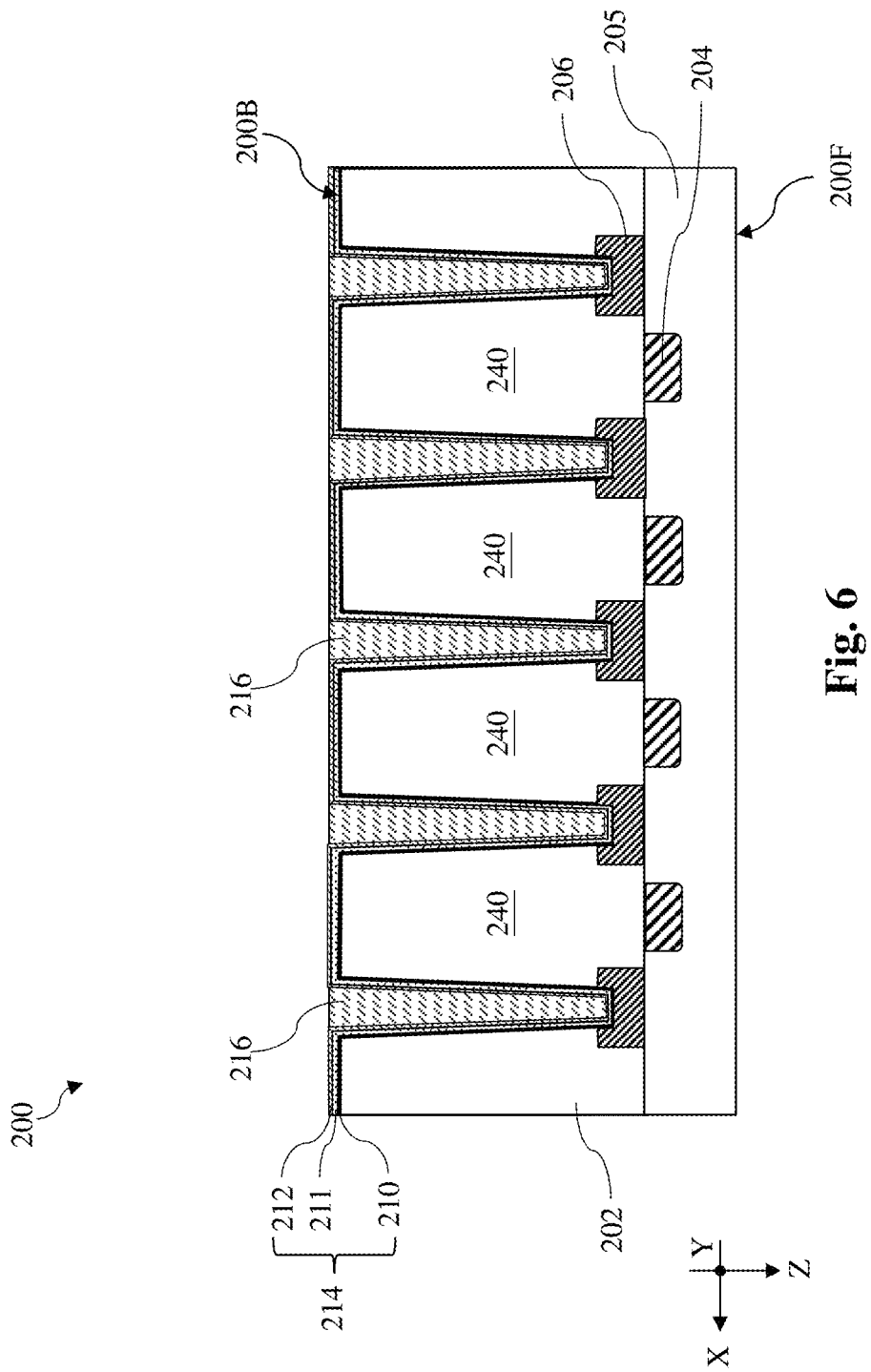

Referring to FIGS. 1 and 6, method 100 includes a block 110 where a metal deep trench isolation (DTI) feature 216 is formed in the deep trench 209. At block 110, a metal is deposited over the workpiece 200, including over and into the deep trench 209 (shown in FIG. 5). The deposition may be performed using physical vapor deposition (PVD) or chemical vapor deposition (CVD). After the deposition of the metal, a chemical mechanical polishing (CMP) process is performed to remove excess metal material over the third dielectric layer 212, thereby forming the metal DTI feature 216. The metal DTI feature 216 may be formed of aluminum (Al), tungsten (W), ruthenium (Ru), cobalt (Co), or copper (Cu). In one embodiment, the metal DTI feature 216 is formed of aluminum (Al). When the metal DTI feature 216 is formed of a highly optically reflective metal, such as aluminum (Al), the metal DTI feature 216 may function as a reflector to reflect light toward the photodetectors 240 to increase quantum efficiency (QE). In other words, the metal DTI feature 216 may allow incident light to bounce around in the photodetectors 240 before the incident light is dissipated, absorbed, or escapes. As illustrated in FIG. 6, the metal DTI feature 216 is spaced apart from the substrate 202 by the dielectric layer 214, including the first dielectric layer 210, the second dielectric layer 211, and the third dielectric layer 212. Reference is still made to FIG. 6. After the CMP process, surfaces of the substrate 202 adjacent the back side 200B remain covered by the dielectric layer 214.

Figure 7:
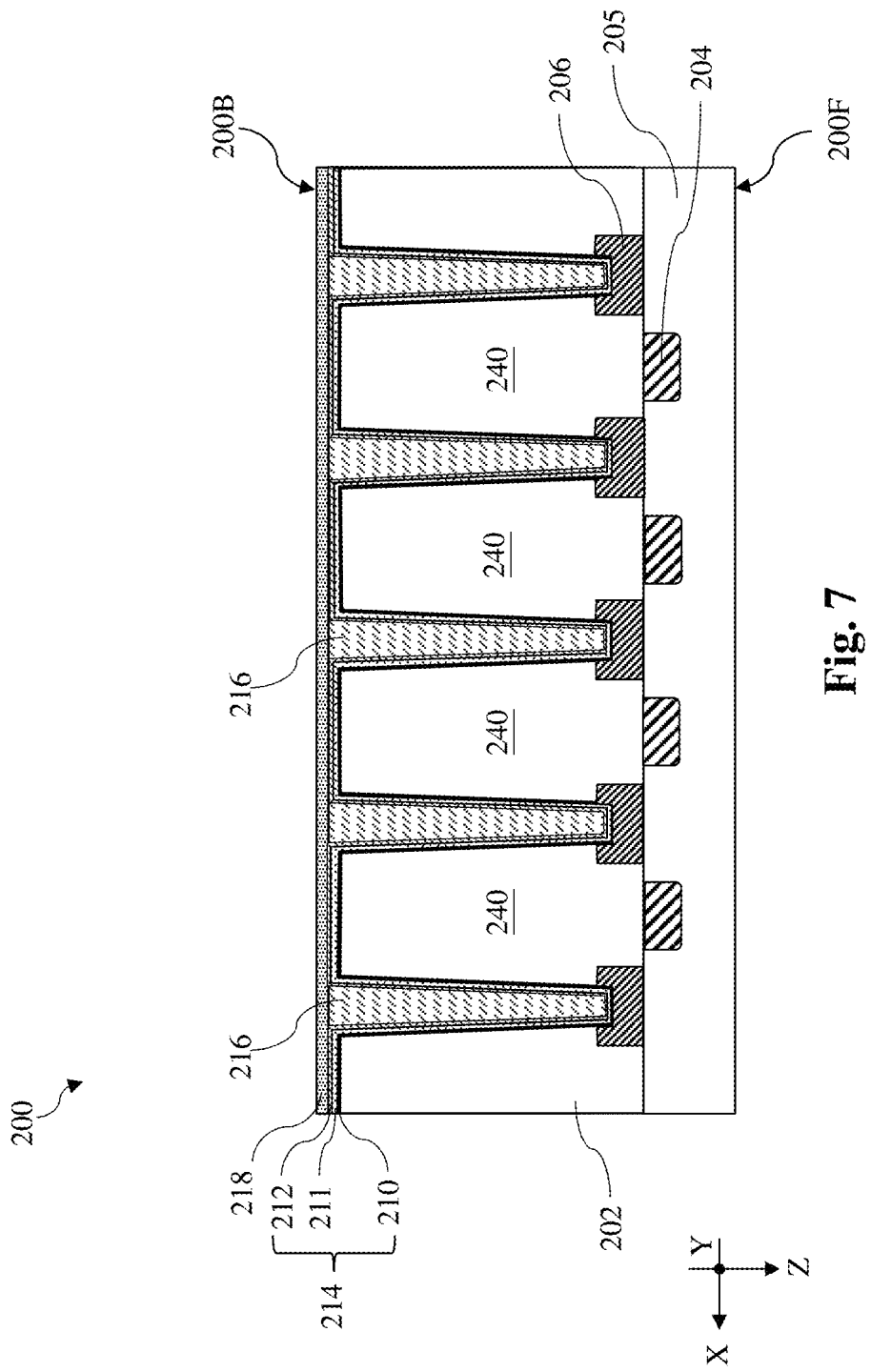

Referring to FIGS. 1 and 7, method 100 includes a block 112 where a top dielectric layer 218 is deposited over the back side 200B. After the formation of the metal DTI feature 216, method 100 deposits a top dielectric layer 218 over the metal DTI feature 216 and the third dielectric layer 212. In some embodiments, the top dielectric layer 218 may be a silicon oxide layer and may be deposited using CVD. In some instances, the top dielectric layer 218 may have a thickness between about 30 nm and about 50 nm. A composition of the top dielectric layer 218 may be similar to the first ILD layer 205.

Figure 8:
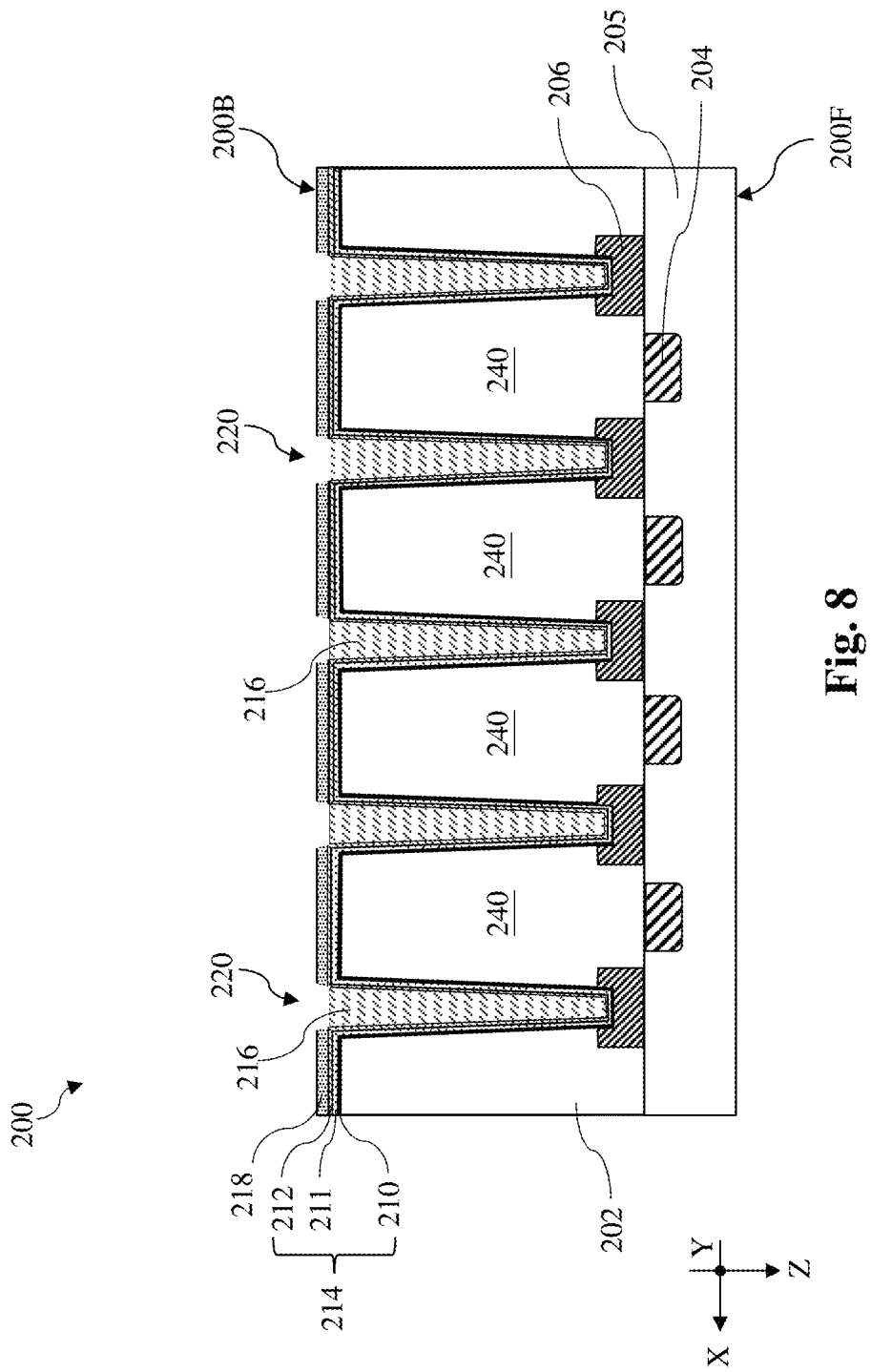

Referring to FIGS. 1 and 8, method 100 includes a block 114 where an access opening 220 is formed in the top dielectric layer 218 to expose the metal DTI feature 216. To form the access opening 220, a hard mask (not shown) may be formed over the top dielectric layer 218. Like the hard mask 208, the hard mask in block 114 may be a single layer or a multilayer and may be deposited using chemical vapor deposition (CVD). Photolithography processes and etch processes are then performed to pattern the hard mask. For example, a photoresist layer (not shown) is formed over the hard mask, exposed to a suitable photolithography radiation source, and developed to form a patterned photoresist layer. The patterned photoresist layer is then used as an etch mask to pattern the hard mask over the top dielectric layer 218. The top dielectric layer is then anisotropically etched using the patterned hard mask as an etch mask, thereby forming the access opening 220. As shown in FIG. 8, more than one access opening 220 are formed and each of the access openings 220 is disposed directly over a metal DTI feature 216, thereby exposing the same. The anisotropic etch may be a dry etch process that implements sulfur hexafluoride ($SF_6$), carbon tetrafluoride ($CF_4$), nitrogen trifluoride ($NF_3$), other fluorine-containing gas, oxygen ($O_2$), or a mixture thereof.

Figure 9:
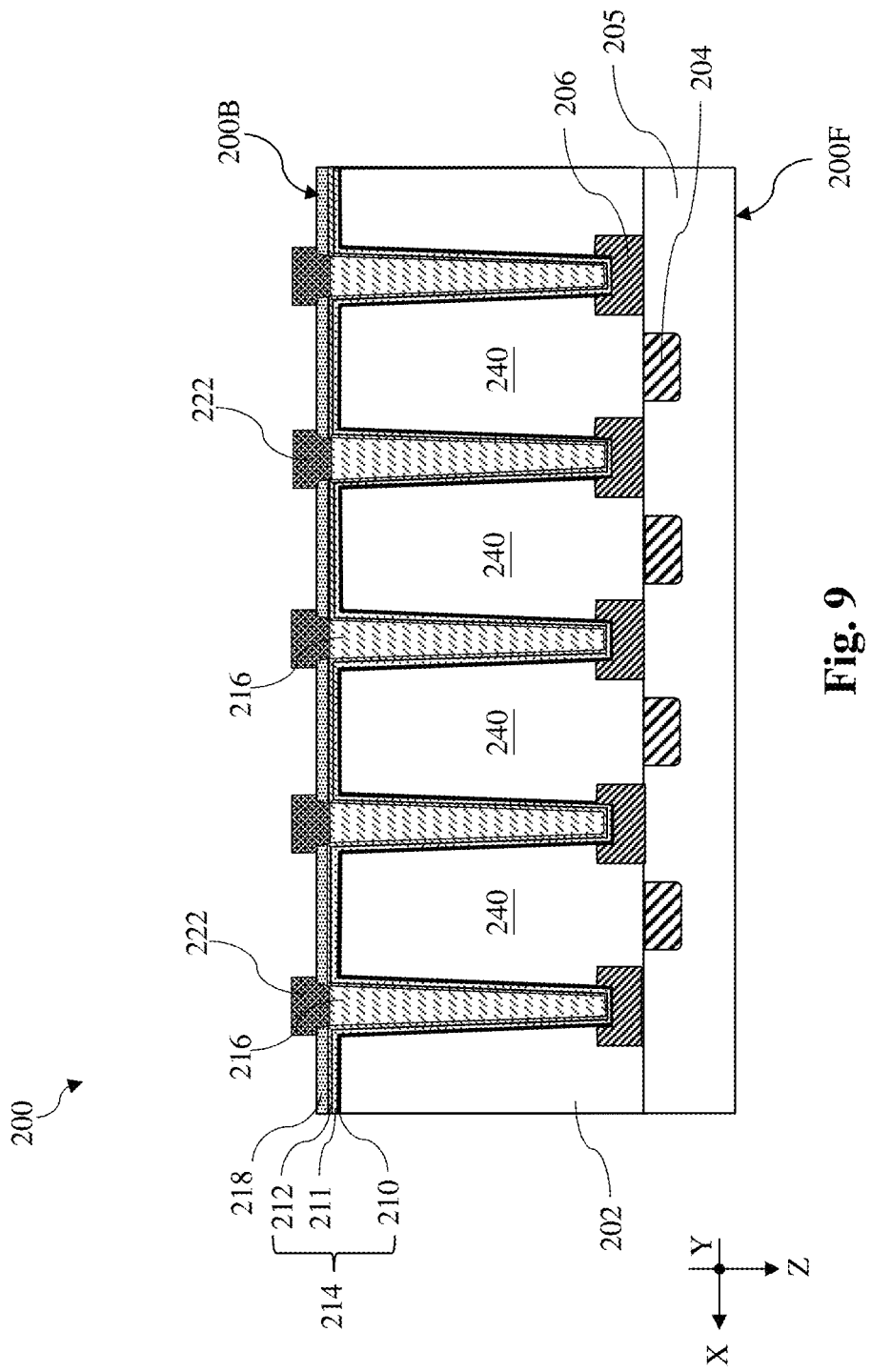
Figure 12:
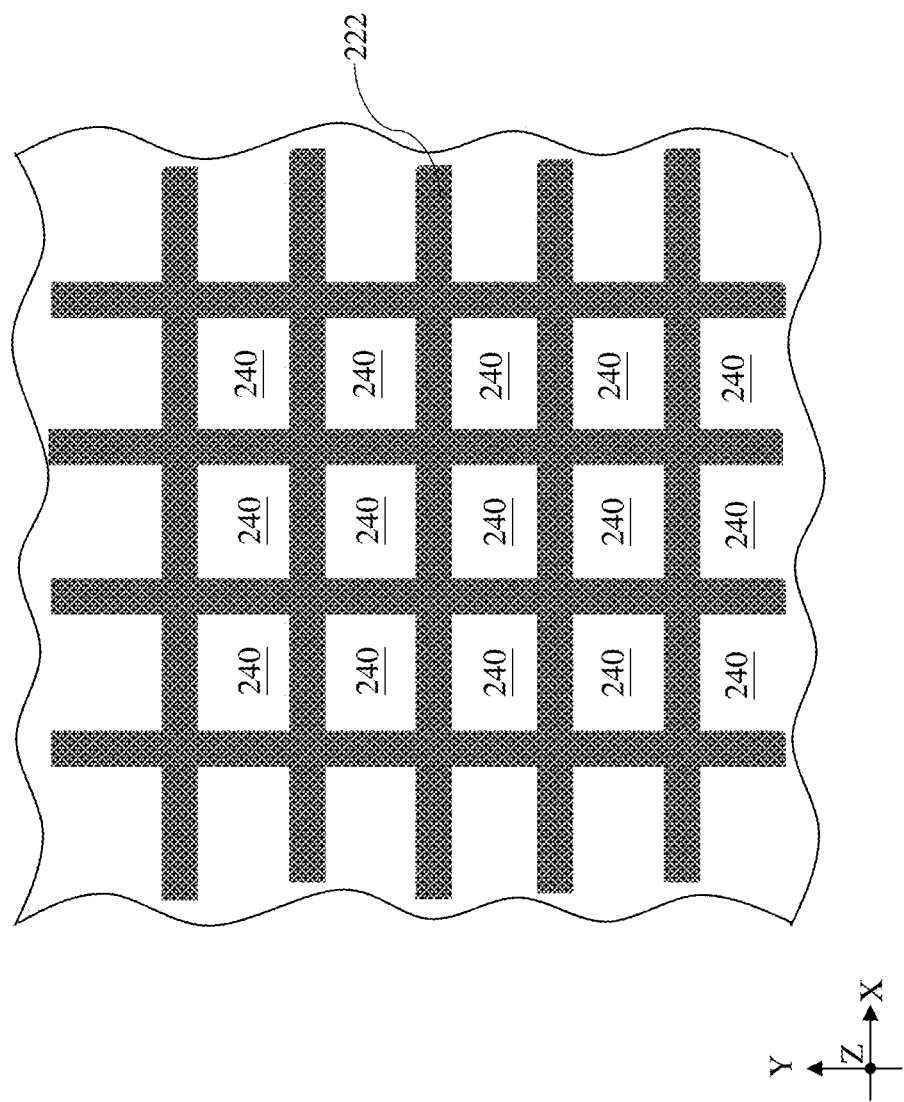
FIG. 12 illustrates a fragmentary top view of a metal grid, according to various aspects of the present disclosure.

Referring to FIGS. 1 and 9, method 100 includes a block 116 where a metal grid 222 is formed over the back side 200B, including in the access opening 220. As its name suggests, the metal grid 222 is a grid-like structure or framework that extends over several, if not all, of the access openings 220. Reference is briefly made to FIG. 12, which illustrates a fragmentary top view of the metal grid 222 from the back side 200B of the workpiece 200. From a top view, the metal grid 222, along with metal DTI features 216 directly below the metal grid 222, define and isolate the photodetectors 240. As shown in FIG. 12, the metal grid 222 define openings to the photodetectors 240 and all the openings are of the same shapes and dimensions. In some embodiments, the metal grid 222 may include aluminum (Al), tungsten (W), ruthenium (Ru), cobalt (Co), or copper (Cu). In one embodiment, the metal grid 222 is formed of aluminum (Al). According to the present disclosure, the metal grid 222 may serve two functions. First, the metal grid 222 may physically block light reflection among adjacent photodetectors 240 and prevent cross-talk among neighboring photodetectors 240. Second, as will be described further below, the metal grid 222 may serve as a distribution network for a negative bias that is ultimately applied to the metal DTI features 216. In these embodiments, the metal grid 222 is in direct contact with the metal DTI features 216 in order to apply the negative bias. The negative bias applied at the metal DTI features 216 provides additional electrical isolation among neighboring photodetectors 240.

Figure 10:
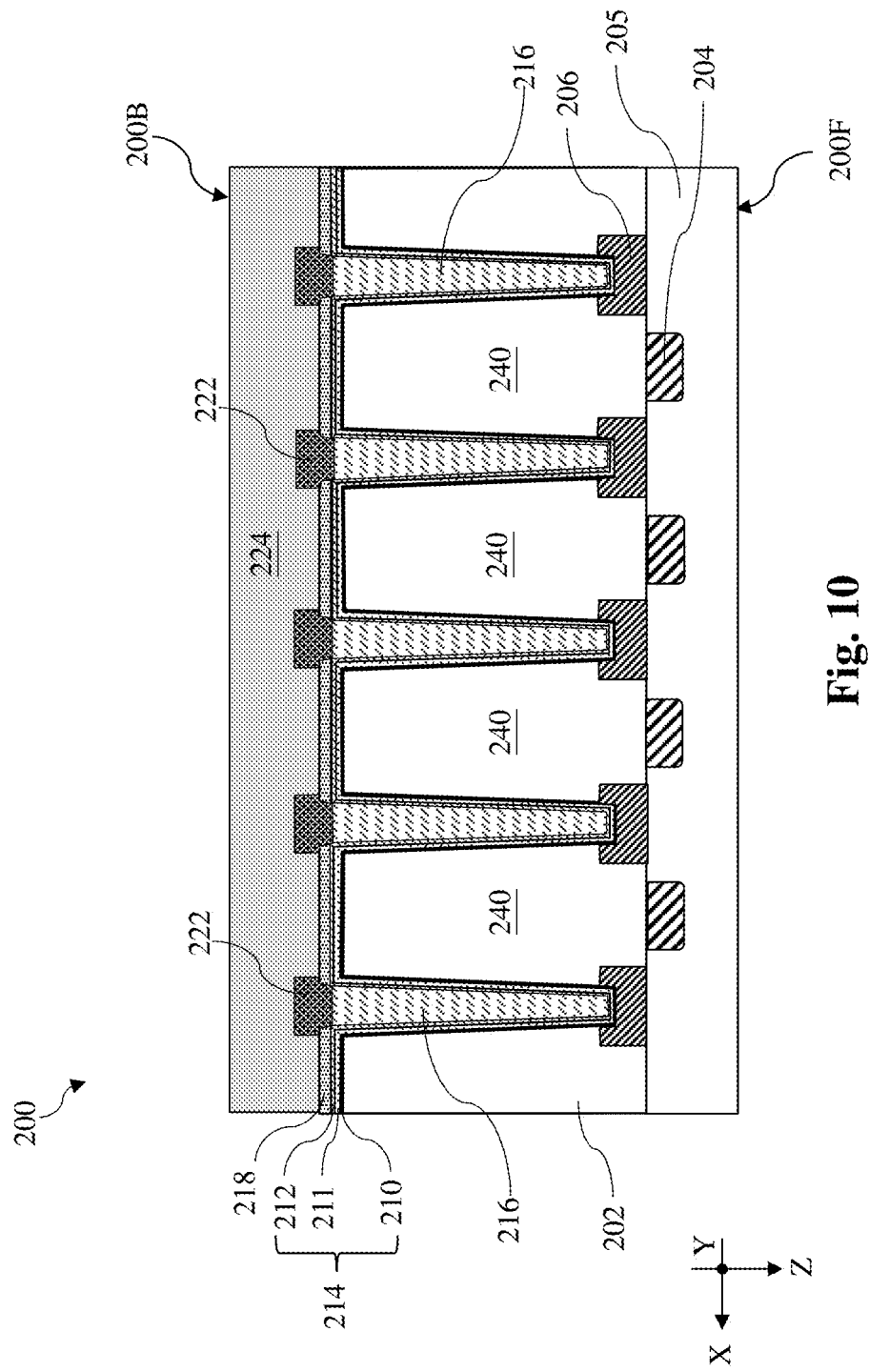

Referring to FIGS. 1 and 10, method 100 includes a block 118 where a color filter 224 is formed over the back side 200B of the workpiece 200. The color filter 224 may be formed of a polymeric material or a resin that includes color pigments. At block 118, a plurality of color filters 224 are then formed over the metal grid 222 to fill the openings in the metal grid 222. In some embodiments, the plurality of color filters 224 may be formed by forming a color filter layer to fill the openings in the metal grid and then patterning the color filter layer. The color filter layer is formed of a material that allows for the transmission of radiation (e.g., light) having a specific range of wavelength, while blocking light of wavelengths outside of the specified range.

Figure 11:
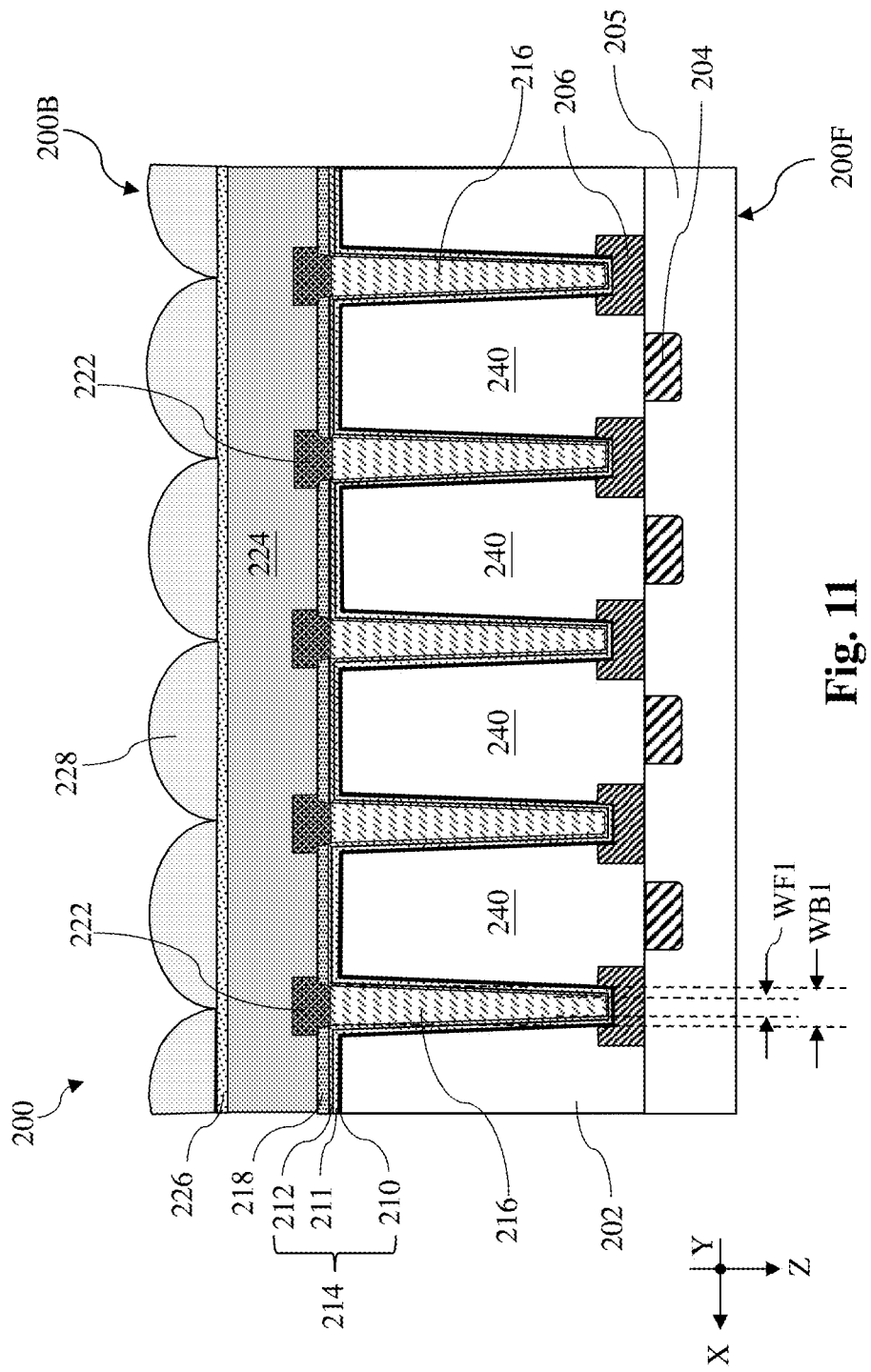

Referring to FIGS. 1 and 11, method 100 includes a block 120 where a planarization layer 226 is deposited over the color filter 224. In some embodiments, the planarization layer 226 may include an organic or polymeric material that has a high transmittance rate for visible light. This allows light to pass through the planarization layer 226 with very little distortion so that it can be detected by the photodetectors 240. The planarization layer 226 may be formed by a spin-on coating method which provides for a uniform and even layer.

Referring to FIGS. 1 and 11, method 100 includes block 122 where microlens features 228 are formed over the planarization layer 226. The microlens features 228 may be formed of any material that may be patterned and formed into lenses, such as a high transmittance acrylic polymer. In an embodiment, a microlens layer may be formed using a material in a liquid state and spin-on techniques. This method has been found to produce a substantially planar surface and a microlens layer having a substantially uniform thickness, thereby providing greater uniformity in the microlens features 228. Other methods, such as CVD, PVD, or the like, may also be used. The planar material for the microlens layer may be patterned using a photolithography and etch technique to pattern the planar material in an array corresponding to the array of photodiodes 240. The planar material may then be reflowed to form an appropriate curved surface for the microlens features 228. The microlens features 228 may be cured using an ultraviolet (UV) treatment.

While method 100 is described in conjunction with the fragmentary cross-sectional views of the workpiece 200 shown in FIGS. 1 and 11, method 100 may be used to form alternative semiconductor structures or image sensors shown in FIGS. 13-18.

Figure 13:
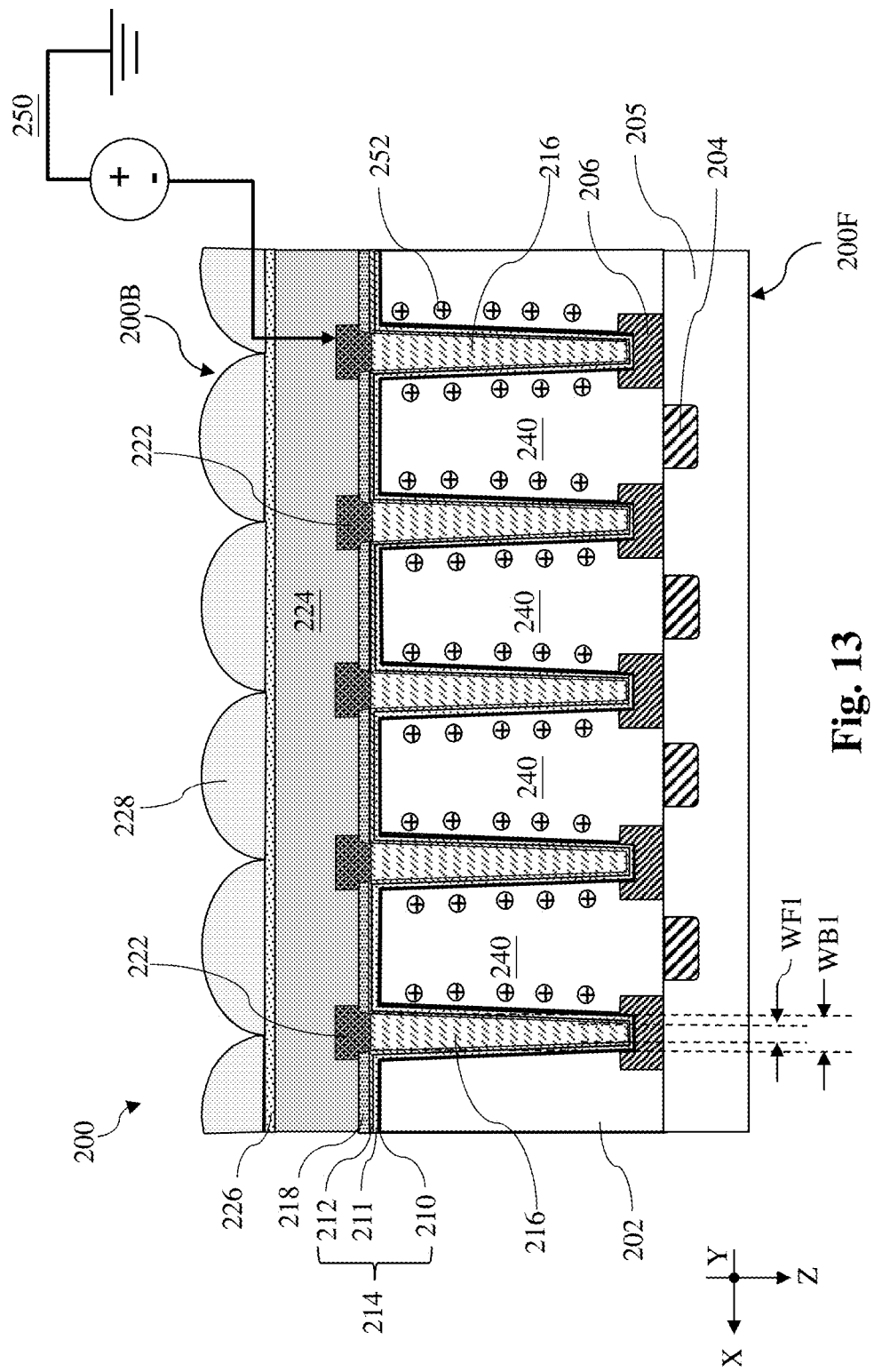
FIGS. 13-18 illustrate alternative embodiments of an image sensor device, according to various aspects of the present disclosure.

FIG. 13 illustrates an image sensor 200 that includes metal DTI features 216 configured to be negatively biased. While the image sensor 200 in FIG. 13 is similar to the image sensor 200 in FIG. 11, it further includes a negative bias source 250 electrically coupled to the metal grid 222. Because the metal grid 222 is in direct contact with the metal DTI features 216, the negative bias source 250 may apply a negative bias at the metal DTI features 216. As shown in FIG. 13, when the negative bias is applied, positive charges or holes 252 may be attracted to the metal DTI feature 216. The attracted positive charges or holes 252 may provide additional electrical isolation between adjacent photodiodes 240.

Figure 14:
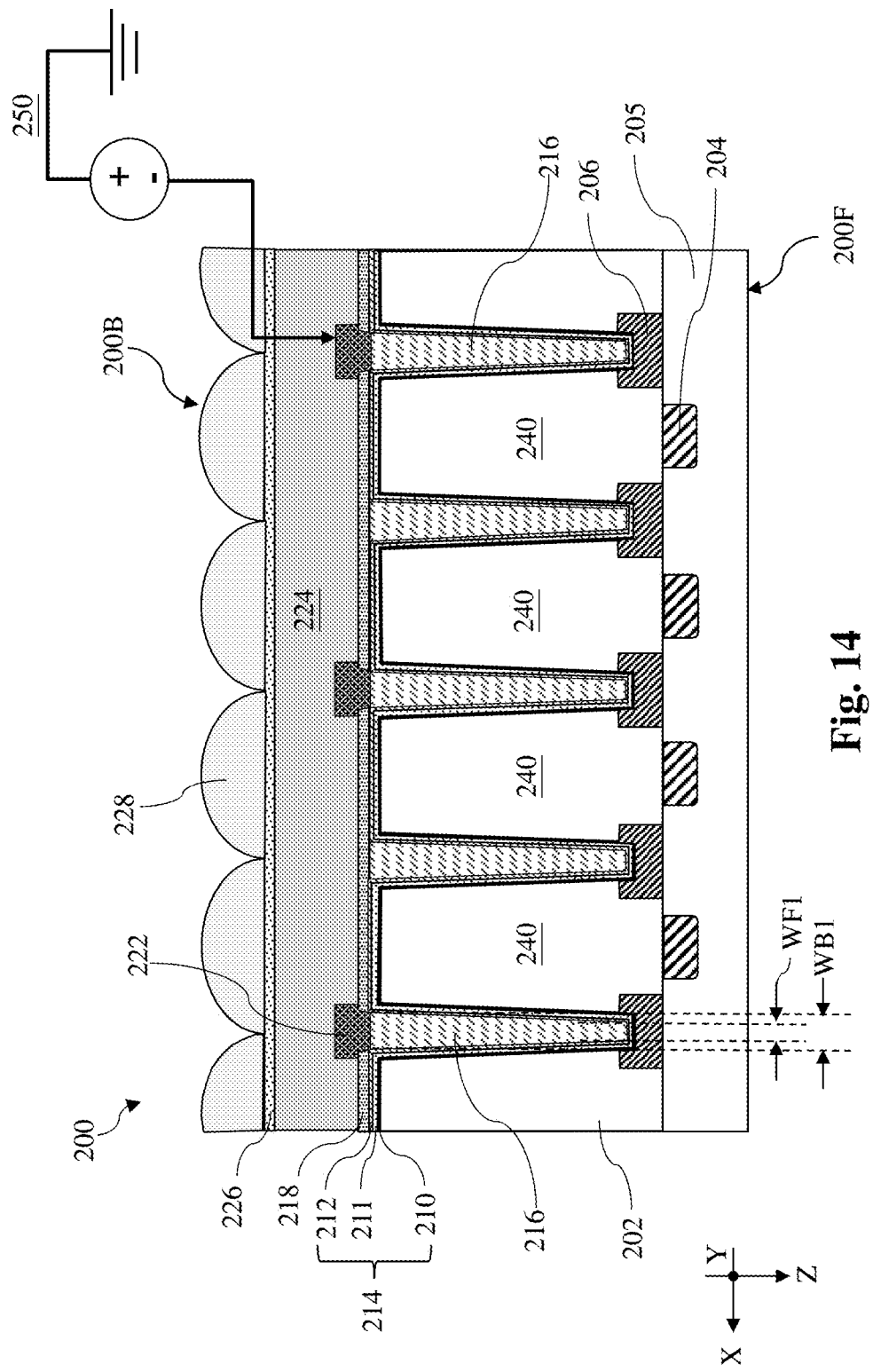

FIG. 14 illustrates an image sensor 200 wherein a portion of the metal grid 222 is omitted to increase aperture for the incidence light. While the image sensor 200 in FIG. 14 is similar to the image sensor 200 in FIG. 11, the metal grid 222 does not land on every metal DTI feature 216. In some embodiments, the metal grid 222 only lands on every other metal DTI feature 216 along the X direction and/or along the Y direction. The metal grid 222, while serving to prevent cross-talk, may reduce the overall aperture of the image sensor 200, causing less amount of light penetration into the photodiodes 240. By removing a portion of the metal grid 222, the image sensor 200 in FIG. 14 may have a larger overall aperture than the image sensor in FIG. 11. Similar to the image sensor 200 in FIG. 13, the image sensor 200 in FIG. 14 may include a negative bias source 250 configured to apply a negative bias at the metal DTI features 216.

Figure 15:
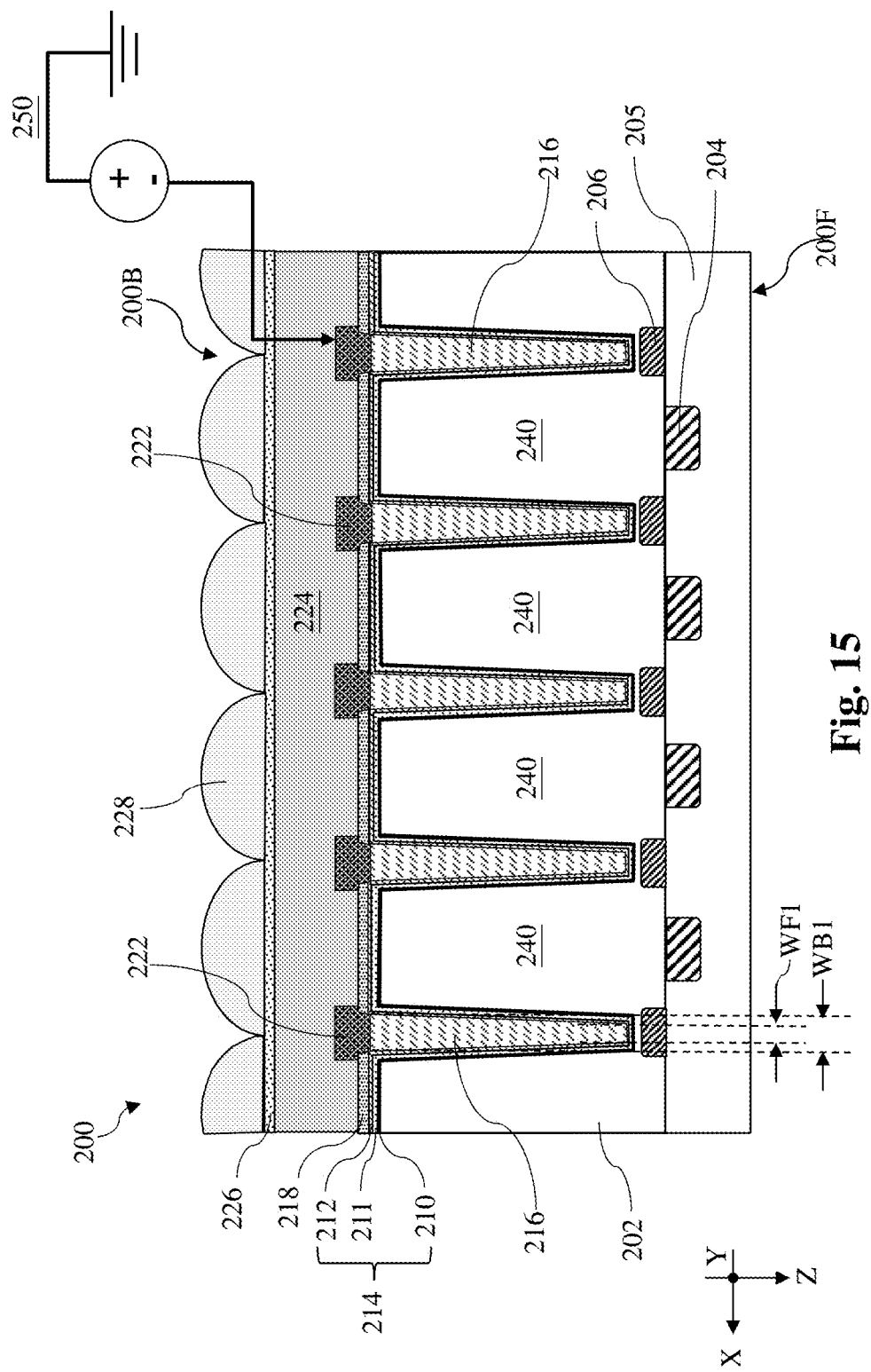

FIG. 15 illustrates an image sensor 200 wherein the metal DTI features 216 does not reach the STI features 206. While the image sensor 200 in FIG. 15 is similar to the image sensor 200 in FIG. 11, the metal DTI feature 216 (or the deep trench 209 wherein the metal DTI feature 216 is situated) falls short of the STI feature 206 adjacent to the front side 200F. This configuration may be referred to as a partial isolation structure because the metal DTI feature 216 does not completely isolate two neighboring photodiodes 240. This partial isolation structure may be implemented when the substrate 202 is thick and metal DTI features 216 may not be satisfactorily formed due to limitations of the etching or deposition processes. Similar to the image sensor 200 in FIG. 13, the image sensor 200 in FIG. 15 may include a negative bias source 250 configured to apply a negative bias at the metal DTI features 216.

Figure 16:
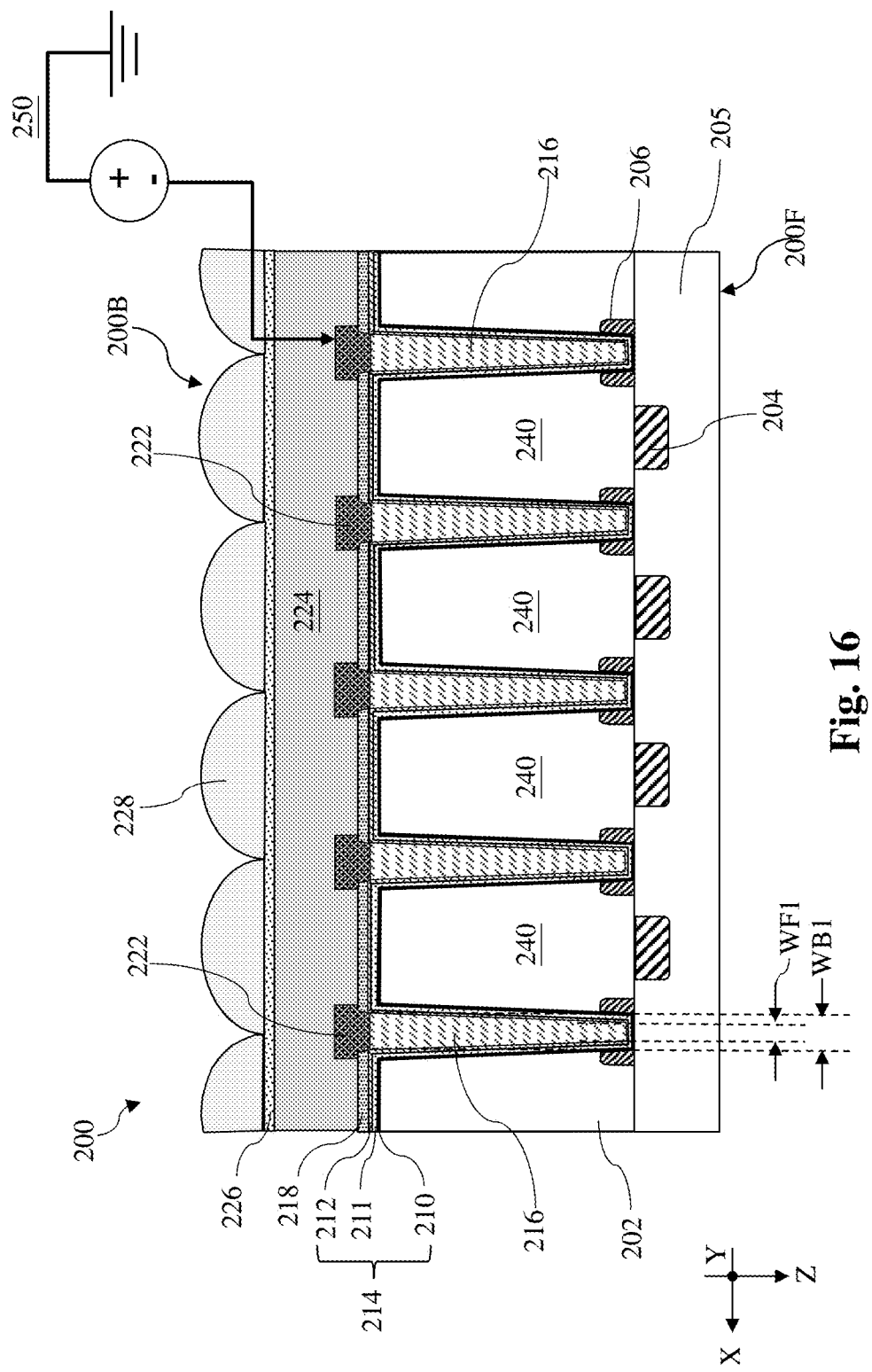

FIG. 16 illustrates an image sensor 200 wherein the metal DTI features 216 extends from the back side 200B and through the STI features 206 adjacent the front side 200F. While the image sensor 200 in FIG. 16 is similar to the image sensor 200 in FIG. 11, the metal DTI feature 216 (or the deep trench 209 wherein the metal DTI feature 216 is situated) extends completely through the substrate 202 and the STI features 206. This configuration may be referred to as a complete isolation structure because the metal DTI feature 216 completely isolates two neighboring photodiodes 240 along the X direction. This complete isolation structure may be implemented to maximize isolation between adjacent photodiodes 240. Similar to the image sensor 200 in FIG. 13, the image sensor 200 in FIG. 16 may include a negative bias source 250 configured to apply a negative bias at the metal DTI features 216.

Metal DTI features 216 illustrated in FIGS. 11 and 13-16 extend into the substrate 202 from the back side 200B of the workpiece 200 and may be referred to as bask-side DTIs. Different from the image sensors 200 in FIGS. 11 and 13-16, the image sensor 200 in FIG. 17 or 18 includes metal DTI features 216 that extend from the front side 200F into the substrate 202. As a result, metal DTI features 216 illustrated in FIGS. 17 and 18 may be referred to as front-side DTIs. As described above, when the optional block 104 of method 100 is not performed before block 106, deep trenches may be formed from the front side 200F of the workpiece 200. In some embodiments represented in FIG. 17 or 18, the deep trenches or the metal DTI features 216 extend through the first ILD layer 205, the STI features 206, and the substrate 202. In some implementations represented in FIG. 17, the metal DTI features 216 do not extend completely through the substrate 202 and may terminate in the substrate 202. In some other implementations represented in FIG. 18, the metal DTI features 216 extend completely through the substrate 202.

Reference is first made to FIG. 17. Different from the image sensor 200 in FIG. 11, the dielectric layer 214 in FIG. 17 is deposited over the front side 200F. As a result, first dielectric layer 210 is in direct contact with the substrate 202, the STI feature 206 and the first ILD layer 205. The second dielectric layer 211 is disposed between the first dielectric layer 210 and the metal DTI feature 216 and the third dielectric layer 212 is disposed between the second dielectric layer 211 and the metal DTI feature 216. Due to the orientation of the workpiece 200, the image sensor 200 in FIG. 17 includes a bottom dielectric layer 2180. The composition and formation process of the bottom dielectric layer 2180 may be similar to those of the top dielectric layer 218. Each of the metal DTI features 216 are now disposed on a front contact feature 2220, which extends through the bottom dielectric layer 2180 to come in direct contact with the metal DTI feature 216. In embodiments where the image sensor 200 includes a negative bias source 250, the negative bias source 250 applies a negative bias to the metal DTI features through the front contact features 2220, rather than the metal grid 222 shown in FIGS. 11 and 13-16. Different from the metal grid 222 that forms the chess-board like framework shown in FIG. 12, the front contact features 2220 resemble contact features in an interconnect structure and do not form a grid. In place of the metal grid 222, the image sensor 200 in FIG. 17 may include a composite grid 270 that includes a conductive grid 274 embedded in a low-refractive-index (low-n) layer 272. In some instances, the low-refractive-index (low-n) layer 272 may be formed of a porous silicon oxide material and the conductive grid 274 may be formed of a metal, such as aluminum. Different from the metal grid 222 shown in FIGS. 11 and 13-16, the conductive grid 274 is insulated from the metal DTI feature 216. As shown in FIG. 17, the conductive grid 274 is spaced apart from the metal DTI features 216 by the substrate 202 and the dielectric layer 214. Because the metal DTI features 216 do not extend completely through the substrate 202, the image sensor 200 includes a partial isolation structure. A second ILD layer 260 may be formed over the bottom dielectric layer 2180 and the front contact feature 2220. The second ILD layer 260 may be similar to the first ILD layer 205 in terms of composition and formation processes.

Reference is then made to FIG. 18. Different from the image sensor 200 in FIG. 17, the dielectric layer 214 over the metal DTI features 216 comes in contact with the composite grid 270. That is, the image sensor 200 in FIG. 18 includes a complete isolation structure where the metal DTI features 216, along with the dielectric layer 214, completely isolate neighboring photodiodes 240. Like the image sensor 200 in FIG. 17, the first dielectric layer 210 is in direct contact with the substrate 202, the STI feature 206 and the first ILD layer 205. The second dielectric layer 211 is disposed between the first dielectric layer 210 and the metal DTI feature 216 and the third dielectric layer 212 is disposed between the second dielectric layer 211 and the metal DTI feature 216. Due to the orientation of the workpiece 200, the image sensor 200 in FIG. 18 includes a bottom dielectric layer 2180. The composition and formation process of the bottom dielectric layer 2180 may be similar to those of the top dielectric layer 218. Each of the metal DTI features 216 are now disposed on a contact feature 2220, which extends through the bottom dielectric layer 2180 to come in direct contact with the metal DTI feature 216. In embodiments where the image sensor 200 includes a negative bias source 250, the negative bias source 250 applies a negative bias to the metal DTI features through the contact features 2220, rather than the metal grid 222 shown in FIGS. 11 and 13-16. Different from the metal grid 222 that forms the chess-board-like framework shown in FIG. 12, the contact features 2220 resemble contact features in an interconnect structure and do not form a grid. In place of the metal grid 222, the image sensor 200 in FIG. 18 may include a composite grid 270 that includes a conductive grid 274 embedded in a low-refractive-index (low-n) layer 272. In some instances, the low-refractive-index (low-n) layer 272 may be formed of a porous silicon oxide material and the conductive grid 274 may be formed of a metal, such as aluminum. Different from the metal grid 222 shown in FIGS. 11 and 13-16, the conductive grid 274 is insulated from the metal DTI feature 216. As shown in FIG. 18, the conductive grid 274 is spaced apart from the metal DTI features 216 by the dielectric layer 214, which includes the first dielectric layer 210, the second dielectric layer 211 and the third dielectric layer 212. A second ILD layer 260 may be formed over the bottom dielectric layer 2180 and the front contact feature 2220. The second ILD layer 260 may be similar to the first ILD layer 205 in terms of composition and formation processes.

Metal DTI features 216 of the present disclosure are tapered. As shown in FIGS. 11 and 13-16, a back-side metal DTI feature 216 has a backside surface in contact with the metal grid 222 and a frontside surface away from the metal grid 222. For backside metal DTI features 216, the backside surface is greater than the frontside surface. In FIGS. 11 and 13-16, the backside surface includes a first backside width WB1 along the X direction and the frontside surface includes a first frontside width WF1 along the X direction. The first backside width WB1 is greater than first frontside width WF1. That is, the metal DTI features 216 in FIGS. 11 and 13-16 are tapering from the backside surface towards the frontside surface. In some instances, the first backside width WB1 may be between about 15 nm and about 6000 nm and the first front side WF1 may be between about 10 nm and about 5000 nm. As shown in FIGS. 17 and 18, a frontside metal DTI feature 216 has a frontside surface in contact with the contact feature 2220 and a backside surface away from the contact feature 2220. For frontside metal DTI features 216, the frontside surface is greater than the backside surface. In FIGS. 17 and 18, the backside surface includes a second backside width WB2 along the X direction and the frontside surface includes a second frontside width WF2 along the X direction. The second frontside width WF2 is greater than second backside width WB2. That is, the metal DTI features 216 in FIGS. 17 and 18 are tapering from the frontside surface towards the backside surface. In some instances, the second backside width WB2 may be between about 10 nm and about 5000 nm and the second front side WF2 may be between about 15 nm and about 6000 nm.

Embodiments of the present disclosure provide benefits. For example, the present disclosure provides images sensors that include photodiodes in a sensor substrate. The photodiodes are separated by metal DTI features that may extend partially or completely through a thickness of the sensor substrate. The metal DTI features may be formed from a front side of the sensor substrate or from a back side of the sensor substrate. As their names suggest, the metal DTI features are formed of a metal and may serve as reflectors to improve quantum efficiency (QE) of the image sensors. Additionally, the metal DTI features may be electrically coupled to a metal grid or contact features that are configured to apply a negative bias at the metal DTI features. The negative bias may improve electrical isolation among adjacent photodiodes. Because the metal DTI features are formed after the formation of the transistors, the processes to form the metal DTI features are readily integratable with processes of different technology generations.

Thus, in some embodiments, the present disclosure provides a semiconductor structure. The semiconductor structure includes a semiconductor layer, a plurality of metal isolation features disposed in the semiconductor layer, a metal grid disposed directly over and in contact with the plurality of metal isolation features, and a plurality of microlens features disposed over the metal grid.

In some embodiments, the plurality of metal isolation features extend partially into the semiconductor layer. In some embodiments, the plurality of metal isolation features extend completely through the semiconductor layer. In some implementations, the plurality of metal isolation features and the metal grid include aluminum. In some implementations, the plurality of metal isolation features are disposed over a plurality of dielectric isolation features disposed in the semiconductor layer. In some instances, the plurality of metal isolation features extend at least partially through a plurality of dielectric isolation features disposed in the semiconductor layer. In some embodiments, the semiconductor structure may further include a first dielectric layer disposed between the semiconductor layer and the plurality of metal isolation features, a second dielectric layer disposed between the first dielectric layer and the plurality of metal isolation features, and a third dielectric layer disposed between the second dielectric layer and the plurality of metal isolation features. A composition of the first dielectric layer is different from a composition of the second dielectric layer and a composition of the third dielectric layer. In some embodiments, the first dielectric layer includes aluminum oxide, hafnium oxide, or a combination thereof, the second dielectric layer includes tantalum oxide, and the third dielectric layer includes silicon oxide. In some embodiments, the semiconductor device may further include a top dielectric layer disposed over the plurality of metal isolation features and the third dielectric layer and the metal grid extends through the top dielectric layer to come in contact with the plurality of metal isolation features. In some implementations, the semiconductor device may further include a color filter disposed between the semiconductor layer and the plurality of microlens features, and a planarization layer disposed between the color filter and the plurality of microlens features.

Another aspect of the present disclosure involves an image sensor. The image sensor includes a first deep trench isolation (DTI) feature and a second DTI feature, a photodetector disposed between the first DTI feature and the second DTI feature, and a metal grid disposed on and in direct contact with the first DTI feature and the second DTI feature. The first DTI feature, the second DTI feature and the metal grid include aluminum.

In some embodiments, the image sensor may further include a bias source electrically coupled to the metal grid and the bias source and the metal grid are configured to apply a negative bias to the first DTI feature and the second DTI feature. In some embodiments, the image sensor may further include a semiconductor layer. The first DTI feature and the second DTI feature extend partially into the semiconductor layer and the semiconductor layer includes a thickness between about 1.5 µm and about 50 µm. In some implementations, the image sensor may further include a semiconductor layer. The first DTI feature and the second DTI feature extend completely into the semiconductor layer and the semiconductor layer includes a thickness between about 1.5 µm and about 50 µm. In some instances, the image sensor may further include a first shallow trench isolation (STI) feature, a second STI feature, and a transistor disposed under the photodetector and between the first STI feature and the second STI feature. The first DTI feature is directly over the first STI feature and the second DTI feature is directly over the second STI feature.

Yet another aspect of the present disclosure involves a method. The method includes receiving a substrate having a plurality of transistor adjacent a front side of the substrate, forming a plurality of deep trenches from a back side of the substrate, after the forming of the plurality of deep trenches, depositing a first dielectric layer over the back side of the substrate, after the depositing of the first dielectric layer, forming a plurality of metal isolation features in the plurality of deep trenches, forming a top dielectric layer over the plurality of metal isolation features, forming a plurality of metal grid openings to expose the plurality of metal isolation features, and forming a metal grid in the plurality of metal grid openings.

In some embodiments, the substrate includes silicon and the substrate includes a thickness between about 1.5 µm and about 50 µm. In some implementations, the forming of the plurality of deep trenches includes depositing aluminum over the back side of the substrate. In some instances, the method may further include before the forming of the plurality of metal isolation features, depositing a second dielectric layer over the first dielectric layer and depositing a third dielectric layer over the second dielectric layer. In some implementations, the first dielectric layer includes aluminum oxide, hafnium oxide, or a combination thereof, the second dielectric layer includes tantalum oxide, and the third dielectric layer includes silicon oxide.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors.

However, other techniques to vary the resistances of the metal conductors may also be utilized as well.

What is claimed is:

1. A semiconductor device, comprising:
  a semiconductor layer comprising a first surface and a second surface opposing the first surface;
  a plurality of dielectric isolation features disposed within the semiconductor layer and adjacent the first surface of the semiconductor layer;
  a plurality of metal isolation features extending from the second surface of the semiconductor layer;
  a metal grid disposed directly over and in contact with the plurality of metal isolation features;
  a plurality of microlens features disposed over the metal grid; and
  a first dielectric layer extending continuously along the second surface of the semiconductor layer, between the semiconductor layer and the plurality of metal isolation features, and between each of the plurality of metal isolation features and one of the plurality of dielectric isolation features.

2. The semiconductor device of claim 1, wherein the plurality of metal isolation features extend partially into the semiconductor layer.

3. The semiconductor device of claim 1, wherein the plurality of metal isolation features extend completely through the semiconductor layer.

4. The semiconductor device of claim 1, wherein the plurality of metal isolation features and the metal grid comprise aluminum.

5. The semiconductor device of claim 1, wherein the plurality of metal isolation features terminate within the semiconductor layer without extending into the plurality of dielectric isolation features.

6. The semiconductor device of claim 1, wherein the plurality of metal isolation features extend at least partially through the plurality of dielectric isolation features.

7. The semiconductor device of claim 1, further comprising:
  a second dielectric layer disposed between the first dielectric layer and the plurality of metal isolation features; and
  a third dielectric layer disposed between the second dielectric layer and the plurality of metal isolation features,
  wherein a composition of the first dielectric layer is different from a composition of the second dielectric layer and a composition of the third dielectric layer.

8. The semiconductor device of claim 7,
  wherein the first dielectric layer comprises aluminum oxide, hafnium oxide, or a combination thereof,
  wherein the second dielectric layer comprises tantalum oxide,
  wherein the third dielectric layer comprises silicon oxide.

9. The semiconductor device of claim 7, further comprising:
  a top dielectric layer disposed over the plurality of metal isolation features and the third dielectric layer,
  wherein the metal grid extends through the top dielectric layer to come in contact with the plurality of metal isolation features.

10. The semiconductor device of claim 7, further comprising:
  a color filter disposed between the semiconductor layer and the plurality of microlens features; and
  a planarization layer disposed between the color filter and the plurality of microlens features.

11. An image sensor, comprising:
  a first deep trench isolation (DTI) feature and a second DTI feature;
  a photodetector disposed between the first DTI feature and the second DTI feature;
  a metal grid disposed on and in direct contact with the first DTI feature and the second DTI feature; and
  a bias source electrically coupled the metal grid,
  wherein the first DTI feature, the second DTI feature and the metal grid comprise aluminum,
  wherein the bias source and the metal grid are configured to apply a negative bias to the first DTI feature and the second DTI feature.

12. The image sensor of claim 11, further comprising:
  a semiconductor layer,
  wherein the first DTI feature and the second DTI feature extend partially into the semiconductor layer,
  wherein the semiconductor layer comprises a thickness between about 1.5 µm and about 50 µm.

13. The image sensor of claim 11, further comprising:
  a semiconductor layer,
  wherein the first DTI feature and the second DTI feature extend completely into the semiconductor layer,
  wherein the semiconductor layer comprises a thickness between about 1.5 µm and about 50 µm.

14. The image sensor of claim 11, further comprising:
  a first shallow trench isolation (STI) feature;
  a second STI feature; and
  a transistor disposed under the photodetector and between the first STI feature and the second STI feature,
  wherein the first DTI feature is directly over the first STI feature and the second DTI feature is directly over the second STI feature.

15. The image sensor of claim 11, further comprising:
  at least one dielectric layer extending continuously from between sidewalls of the first DTI feature and the photodetector to over a top surface of the photodetector.

16. A structure, comprising:
  a substrate;
  a first deep trench isolation (DTI) feature and a second DTI feature extending into the substrate;
  a metal oxide layer disposed between the first DTI feature and the substrate as well as between the second DTI feature and the substrate;
  a metal grid disposed on and in direct contact with the first DTI feature and the second DTI feature; and
  a first dielectric layer between the metal oxide layer and the first DTI feature as well as between the metal oxide layer and the second DTI feature,
  wherein the first dielectric layer comprises tantalum oxide ($Ta_2O_5$), titanium oxide, zirconium oxide, or a combination thereof.

17. The structure of claim 16, wherein the first DTI feature, the second DTI feature and the metal grid comprise aluminum.

18. The structure of claim 16, wherein the metal oxide layer comprises aluminum oxide, hafnium oxide, titanium oxide, barium titanate, zirconium oxide, lanthanum oxide, barium oxide, strontium oxide, yttrium oxide, or a combination thereof.

19. The structure of claim 16, further comprising:
  a second dielectric layer disposed over a top surface of the first dielectric layer,
  wherein the second dielectric layer comprises silicon oxide.

20. The structure of claim 16, further comprising:
a bias source electrically coupled the metal grid,
wherein the bias source and the metal grid are configured apply a negative bias to the first DTI feature and the second DTI feature.

* * * * *